United States Patent
Muraoka et al.

(10) Patent No.: US 7,577,022 B2
(45) Date of Patent: Aug. 18, 2009

(54) ELECTRIC ELEMENT, MEMORY DEVICE, AND SEMICONDUCTOR INTEGRATED CIRCUIT FORMED USING A STATE-VARIABLE MATERIAL WHOSE RESISTANCE VALUE VARIES ACCORDING TO AN APPLIED PULSE VOLTAGE

(75) Inventors: Shunsaku Muraoka, Osaka (JP); Koichi Osano, Osaka (JP); Satoru Mitani, Osaka (JP); Hiroshi Seki, Nara (JP)

(73) Assignee: Panasonic Corporation, Osaka (JP)

( * ) Notice: Subject to any disclaimer, the term of this patent is extended or adjusted under 35 U.S.C. 154(b) by 143 days.

(21) Appl. No.: 11/918,983

(22) PCT Filed: Sep. 9, 2005

(86) PCT No.: PCT/JP2005/017099

§ 371 (c)(1),
(2), (4) Date: Oct. 22, 2007

(87) PCT Pub. No.: WO2006/114904

PCT Pub. Date: Nov. 2, 2006

(65) Prior Publication Data

US 2009/0067215 A1   Mar. 12, 2009

(30) Foreign Application Priority Data

Apr. 22, 2005   (JP) .............................. 2005-125686

(51) Int. Cl.
*G11C 11/00* (2006.01)
(52) U.S. Cl. .................. 365/159; 365/148; 365/163
(58) Field of Classification Search ................ 365/158, 365/148, 163
See application file for complete search history.

(56) References Cited

U.S. PATENT DOCUMENTS

| 6,204,139 | B1 |   | 3/2001  | Liu et al. |
| 6,673,691 | B2 |   | 1/2004  | Zhuang et al. |
| 7,050,327 | B2 | * | 5/2006  | Campbell .................. 365/159 |
| 7,459,716 | B2 | * | 12/2008 | Toda et al. ................. 365/148 |
| 2004/0090823 | A1 |   | 5/2004  | Brocklin et al. |
| 2004/0145944 | A1 |   | 7/2004  | Pashmakov |
| 2007/0297231 | A1 | * | 12/2007 | Gilton .................. 365/185.14 |
| 2008/0258129 | A1 | * | 10/2008 | Toda .......................... 365/148 |

FOREIGN PATENT DOCUMENTS

EP   1 426 966 A2   6/2004

OTHER PUBLICATIONS

Zhuang et al., "Novell Colossal Magnetoresistive Thin Film Nonvolatile Resistance Random Access Memory (RRAM)," pp. 193-196, IEEE, 2002, USA.

* cited by examiner

*Primary Examiner*—Tuan T. Nguyen
(74) *Attorney, Agent, or Firm*—McDermott Will & Emery LLP

(57) ABSTRACT

An electric element includes: a first electrode (1); a second electrode (3); and a layer (2) connected between the first electrode and the second electrode and having a diode characteristic and a variable resistance characteristic. The layer (2) conducts a substantial electric current in a forward direction extending from one of the first electrode (1) and the second electrode (3) to the other electrode as compared to a reverse direction opposite of the forward direction. The resistance value of the layer (2) for the forward direction increases or decreases according to a predetermined pulse voltage applied between the first electrode (1) and the second electrode (3).

46 Claims, 14 Drawing Sheets

ELECTRIC ELEMENT, MEMORY DEVICE, AND SEMICONDUCTOR INTEGRATED CIRCUIT FORMED USING A STATE-VARIABLE MATERIAL WHOSE RESISTANCE VALUE VARIES ACCORDING TO AN APPLIED PULSE VOLTAGE

RELATED APPLICATIONS

This application is the U.S. National Phase under 35 U.S.C. § 371 of International Application No. PCT/JP2005/017099, filed on Sep. 9, 2005, which in turn claims the benefit of Japanese Application No. 2005-125686, filed on Apr. 22, 2005, the disclosures of which Applications are incorporated by reference herein.

TECHNICAL FIELD

The present invention relates to an electric element, memory device, and semiconductor integrated circuit formed using a state-variable material whose resistance value varies according to an applied pulse voltage.

BACKGROUND ART

In recent years, along with the advancement of the digital techniques in electronic devices, demands for nonvolatile memory devices have been increasing for storage of data, such as a picture, and the like. Further, demands for increasing the capacity of a memory device, reducing the write power, shortening the read and write times, and prolonging the device's life have been escalating. To meet such demands, U.S. Pat. No. 6,204,139 discloses a technique for forming a nonvolatile memory device using a perovskite material whose resistance value varies according to an applied electric pulse (e.g., $Pr_{(1-x)}Ca_xMnO_3$ (PCMO), $LaSrMnO_3$ (LSMO), $GdBa-Co_xO_Y$ (GBCO), etc.). According to the technique disclosed in this publication, a predetermined electric pulse is applied to these materials (hereinafter, generically referred to as "variable-resistance material(s)") to increase or decrease the resistance value of the materials. The resistance value which has varied as a result of application of the pulse is used for memorization of different values. Based on this scheme, the materials are used for memory devices.

U.S. Pat. No. 6,673,691 discloses a method for changing the resistance value of a variable-resistance material by changing the pulse width of an electric pulse. U.S. Pat. No. 6,673,691 further discloses an example of a 1D1R (1 diode/1 resistor) memory cell array wherein a memory cell is formed using these variable-resistance materials, and a diode is used as a memory cell selection device. An advantage of this structure is a smaller memory cell size as compared with a structure which includes a transistor as a memory cell selection device.

FIG. 17 shows a memory device (1D1R nonvolatile memory device) 900 formed using a conventional variable-resistance material disclosed in U.S. Pat. No. 6,673,691. In this conventional example, the memory device 900 includes a substrate 901, a P/N junction diode (N-type Si region 902, P-type Si regions 903-1 and 903-2) formed on the substrate 901, a lower electrode 904-1 formed on the P-type Si region 903-1 of the diode, a lower electrode 904-2 formed on the P-type Si region 903-2 of the diode, a contact plug 905 formed on the N-type Si region 902 of the diode, a variable-resistance material layer 906 formed over the lower electrodes 904-1 and 904-2, and upper electrodes 907-1 and 907-2 formed on the variable-resistance material layer 906. In this conventional example, the lower electrodes 904-1 and 904-2 and the upper electrodes 907-1 and 907-2 are formed of Pt, and the variable-resistance material layer 906 is formed of $Pr_{0.7}Ca_{0.3}MnO_3$.

In the memory device 900 shown in FIG. 17, when a predetermined pulse is applied between the upper electrode 907-1 and the lower electrode 904-1, the resistance value of a portion of the variable-resistance material layer 906 between the upper electrode 907-1 and the lower electrode 904-1 (variable region 906α) is varied. When a predetermined pulse is applied between the upper electrode 907-2 and the lower electrode 904-2, the resistance value of a portion of the variable-resistance material layer 906 between the upper electrode 907-2 and the lower electrode 904-2 (variable region 906β) is varied. That is, in this memory device, each of the variable region 906α and the variable region 906β is used as a single memory cell.

In the memory device 900 shown in FIG. 17, the P/N junction diode formed on the substrate 901 is used as a diode for selection of memory cells. Thus, an electric current flows from the upper electrode 907-1 (907-2) to the lower electrode 904-1 (904-2) (forward direction) but does not flow from the lower electrode 904-1 (904-2) to the upper electrode 907-1 (907-2) (reverse direction) or between the upper electrode 907-1 and the upper electrode 907-2.

FIG. 18 shows an equivalent circuit of the memory device 900 of FIG. 17. In FIG. 18, a word line W1 corresponds to the upper electrode 907-1, a word line W2 corresponds to the upper electrode 907-2, and a bit line B1 corresponds to the contact plug 905. A memory cell MC911 corresponds to the variable region 906α, a diode D911 corresponds to the diode (N-type Si region 902, P-type Si region 903-1), a memory cell MC912 corresponds to the variable region 906β, and a diode D912 corresponds to the diode (N-type Si region 902, P-type Si region 903-2).

<Operation>

Next, an operation of the memory device 900 of FIG. 17 is described with reference to FIG. 18. Herein, a process with the memory cell MC911 is described.

[Set (Memorization) or Reset]

In a memorization process, the word line W2 and the bit line B1 are pulled down to the ground, and a predetermined electric pulse is applied to the word line W1. As a result, the resistance value of the memory cell MC911 changes to a low resistance state (reset) or high resistance state (set). In an example disclosed in U.S. Pat. No. 6,673,691, when a pulse voltage having a voltage value of +4 V and a pulse width of 100 nsec is applied, the resistance value of the memory cell MC911 changes from the high resistance state to the low resistance state. When a pulse voltage having a voltage value of +2.5 V and a pulse width of 10 μsec is applied, the resistance value of the memory cell MC911 changes from the low resistance state to the high resistance state.

[Reproduction]

In a reproduction process, the word line W2 and the bit line B1 are pulled down to the ground, and a predetermined reproduction voltage (e.g., a voltage having a voltage value of +0.5 V) is applied to the word line W1. As a result, the electric current flowing through the memory cell MC911 is released to the bit line B1. On the other hand, no electric current flows through the memory cell MC912. Since the diode D912 (the N-type Si region 902 and P-type Si region 903-2 of FIG. 17) is provided to the memory cell MC912, no electric current flows from the word line W1 to the word line W2. Thus, only the resistance value of the memory cell MC911 can be detected.

According to the schemes as described above, the conventional memory device (1D1R nonvolatile memory device) 900 performs recording or reproduction in each memory cell.

However, in such a device using a diode (1D1R nonvolatile memory device), it is necessary to form a diode of P/N junction on the substrate 901. To form a memory cell, it is further necessary to form the lower electrodes 904-1 and 904-2 and the variable-resistance material layer 906 on the diode. Such a structure requires a complicated production process and is therefore unsuitable for practical use. It should be further noted that, in the memory device 900 of FIG. 17, even if a pulse voltage is applied to the variable region 906α (906β) such that the upper electrode 907-1 (907-2) becomes negative (−) with respect to the lower electrode 904-1 (904-2), it does not mean application of a predetermined pulse voltage to the variable region 906α (906β) because the diode is formed. That is, in the memory device 900 of FIG. 17, in order to allow the resistance value of the variable region 906α (906β) to vary, it is necessary to apply a pulse voltage such that the upper electrode 907-1 (907-2) becomes positive (+) with respect to the lower electrode 904-1 (904-2). Thus, the polarity of a pulse voltage to be applied to the variable-resistance material is restricted.

In the memory device 900 of FIG. 17, the interval of 100 nsec is required for changing (setting) the resistance state of a memory cell from the high resistance state to the low resistance state, and the interval of 10 μsec is required for changing (resetting) the resistance state of a memory cell from the low resistance state to the high resistance state. To quickly perform setting or resetting of this memory cell, it is necessary to shorten the pulse width of a pulse voltage to be applied.

DISCLOSURE OF INVENTION

According to an aspect of the present invention, an electric element comprises: a first electrode; a second electrode; and a layer connected between the first electrode and the second electrode and having a diode characteristic and a variable resistance characteristic, wherein the layer conducts a substantial electric current in a forward direction extending from one of the first electrode and the second electrode to the other electrode as compared to a reverse direction opposite of the forward direction, and the resistance value of the layer for the forward direction increases or decreases according to a predetermined pulse voltage applied between the first electrode and the second electrode.

Since the electric element has the "diode characteristic", the direction of the electric current can be defined without using a diode element therefor. Further, the electric element has the "variable-resistance characteristic" and therefore can be used as, for example, a 1R1D nonvolatile memory. In such a use, it is not necessary to provide a diode, and therefore, the production process is simplified, as compared with a conventional 1R1D nonvolatile memory. Furthermore, since a diode is not provided, the polarity of a pulse voltage to be applied to the variable-resistance material is not restricted. Therefore, both a pulse voltage of positive (+) polarity and a pulse voltage of negative (−) polarity can be applied to the state-variable material layer. In such a pulse application method (wherein the resistance value is changed according to the polarity of the pulse voltage), the pulse width of a pulse voltage applied is short as compared with a conventional pulse application method (a method wherein the resistance value of the variable-resistance material is changed by adjusting the pulse width of the pulse voltage). That is, the time required for memorization or reset can be shortened.

Preferably, the work function of the first electrode is different from that of the second electrode.

In the above electric element, when the first electrode and the second electrode have different work functions, the state-variable material has the diode characteristic and the variable-resistance characteristic. Therefore, by providing a difference between the work functions of the first electrode and the second electrode, an electric element can be formed wherein the state-variable material has the "diode characteristic" and the "variable-resistance characteristic".

Preferably, the crystallinity of the layer is nonuniform.

In the above electric element, when the crystallinity of the state-variable material layer is nonuniform, the state-variable material layer exhibits the diode characteristic and the variable-resistance characteristic. Therefore, by making the crystallinity of the state-variable material layer nonuniform, an electric element can be formed wherein the state-variable material has the "diode characteristic" and the "variable-resistance characteristic".

Preferably, the electric element stores 1-bit or multi-bit information by applying a predetermined pulse voltage between the first electrode and the second electrode such that the resistance value for the forward direction is changed.

In the above electric element, the pulse width of a pulse voltage applied for memorization or reset is short as compared with a conventional pulse voltage. That is, the time required for memorization or reset can be shortened.

Preferably, 1-bit or multi-bit information is read from the electric element by applying a predetermined pulse voltage between the first electrode and the second electrode such that an electric current flows in the forward direction according to the resistance value of the layer.

Since the above electric element has the "diode characteristic", the direction of the electric current can be defined without using a diode element therefor. Thus, the electric element can be used as, for example, a 1R1D nonvolatile memory. In such a use, it is not necessary to provide a diode, and therefore, the production process is simplified, as compared with a conventional 1R1D nonvolatile memory.

According to another aspect of the present invention, a memory device, comprises: a plurality of electric elements of claim 1 formed in a matrix; a plurality of word lines; a word line driver for applying a predetermined voltage to the plurality word lines; a plurality of bit lines; and a bit line driver for applying a predetermined voltage to the plurality bit lines, wherein in each of the plurality of electric elements, the first electrode is connected to any one of the plurality of word lines, and the second electrode is connected to any one of the plurality of bit lines.

Since in the memory device the electric element has the "diode characteristic", no electric current flows from a word line to another word line. Thus, a memory device can be produced without additionally providing a diode element.

Preferably, in order to store information in any one of the plurality electric elements, the word line driver applies a first pulse voltage to one of the plurality of word lines which is connected to an electric element in which the information is to be stored, and the bit line driver applies a second pulse voltage to one of the plurality of bit lines which is connected to the electric element in which the information is to be stored.

In the above memory device, a predetermined pulse voltage is applied to an electric element in which information is to be stored, while the predetermined pulse voltage is not applied to the other electric elements. As a result, only the resistance state of the electric element in which information is to be stored can be changed. That is, it is possible to arbitrarily select an electric element and store information in the selected electric element.

Preferably, in order to reproduce information stored in any one of the plurality of electric elements, the word line driver applies a reproduction voltage to one of the plurality of word lines which is connected to an electric element from which the information is to be read, and the bit line driver applies the reproduction voltage to the plurality of bit lines except for the one that is connected to the electric element from which the information is to be read.

In the above memory device, in the electric element from which the information is to be read, an electric current flows in the forward direction, while no electric current flows in the forward direction in the other electric elements. Thus, it is possible to read only the electric current flowing through the electric element from which information is to be read. That is, it is possible to arbitrarily select an electric element and read information stored in the selected electric element.

Preferably, the electric element comprises: a lower electrode corresponding to the second electrode and formed on a substrate, wherein the layer is formed on the lower electrode; and an upper electrode corresponding to the first electrode and formed on the layer, wherein the layer includes a region between the upper electrode and the lower electrode and having a diode characteristic and a variable resistance characteristic.

Preferably, the upper electrode corresponds to a first upper electrode and the region corresponds to a first region further comprising a second upper electrode formed on the layer, wherein the layer includes a second region between the second upper electrode and the lower electrode, the second region conducts a substantial electric current in a forward direction extending from one of the second upper electrode and the lower electrode to the other electrode as compared to a reverse direction opposite of forward direction, and the resistance value of the second region for the forward direction increases or decreases according to a predetermined pulse voltage applied between the second upper electrode and the lower electrode.

In the above electric element, the direction of a current flow is defined. Therefore, the current does not flow from the first upper electrode to the second upper electrode through the lower electrode. Thus, a memory device can be produced without additionally forming a diode.

Preferably, the electric element further comprises a voltage driver, the voltage driver applying the pulse voltage between the first electrode and the second electrode such that the first electrode becomes negative with respect to the second electrode to increase the resistance value of the layer for the forward direction; and the voltage driver applying the pulse voltage between the first electrode and the second electrode such that the first electrode becomes positive with respect to the second electrode to decrease the resistance value of the layer for the forward direction.

Preferably, the electric element further comprises a voltage driver for applying a measurement voltage between the first electrode and the second electrode such that the first electrode becomes positive with respect to the second electrode in order to measure a resistance value of the layer for the forward direction.

Preferably, each of the plurality of memory elements is configured to emulate a diode.

BEST MODE FOR CARRYING OUT THE INVENTION

Figure 1:
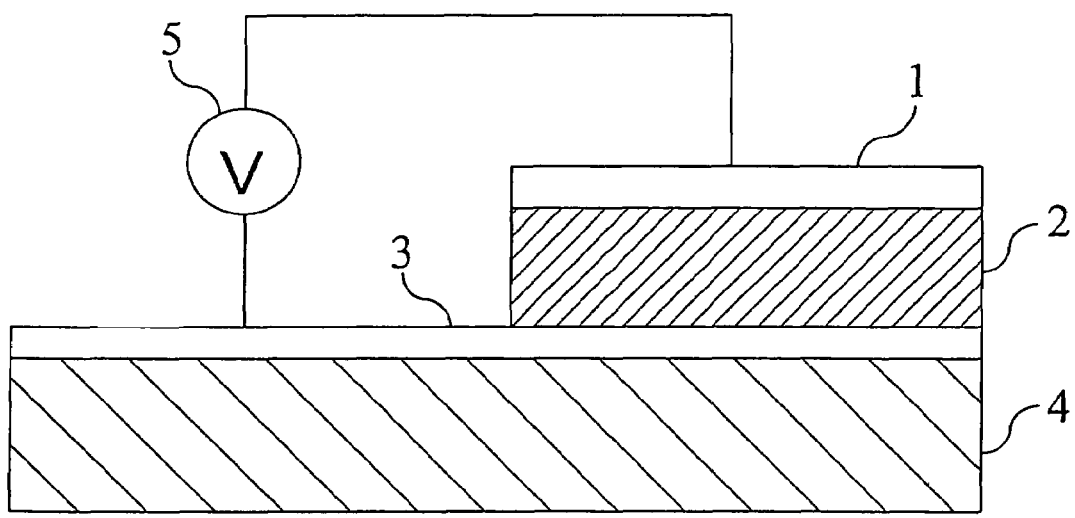
FIG. 1 shows a basic structure of an electric element.

Hereinafter, embodiments of the present invention are described in detail with reference to the drawings. In this specification, like reference numerals are denoted by like elements, and descriptions thereof are not repeated.

(Basic Structure and Basic Characteristics of Electric Element)

The basic structure and basic characteristics of an electric element used in the embodiments of the present invention are described.

FIG. 1 shows a basic structure of the electric element. The electric element includes a substrate 4, a lower electrode 3 formed on the substrate 4, a state-variable material layer 2 formed on the lower electrode 3, and an upper electrode 1 formed on the state-variable material layer 2. A power supply 5 applies a predetermined voltage between the upper electrode 1 and the lower electrode 3.

According to the present invention, the state-variable material of the state-variable material layer 2 exhibits a characteristic such that an electric current readily flows in the forward direction but does not readily flow in the reverse direction (diode characteristic) and a characteristic such that the resistance value is increased or decreased by application of a predetermined pulse voltage (variable-resistance characteristic). The state-variable material of the layer 2 is a metal oxide material of a spinel structure, a ferroelectric oxide including an ilmenite structure metal added thereto, or a perovskite structure material having at least one of CMR characteristic and high-temperature superconductivity. Specifically, the state-variable material of the layer 2 can be selected from the following materials: $CoFe_2O_4$, $CuFe_2O_4$, $NiCr_2O_4$, $Fe_3O_4$, $Cr$—$SrTiO_3$, $Sr$—$LiNbO_3$, $Mg$—$LiNbO_3$, $Pr_{(1-X)}Ca_XMnO_3$ ($0<X<0.5$), $LaSrMnO_3$, $GdBaCo_XO_Y$ ($0<X<2$, $0<Y<7$), etc.

Next, a method for realizing the state-variable material layer 2 having the above-described characteristics (variable-resistance characteristic and diode characteristic) is described.

EXAMPLE 1

To realize the state-variable material layer 2 having the above-described characteristics (variable-resistance characteristic and diode characteristic), the upper electrode 1 and the lower electrode 3 are formed of different materials having different work functions in the electric element of FIG. 1. The reasons therefor are described below.

<Subjects of Experiments>

We carried out experiments on the following three types of electric elements.

Sample (A): Electric element in which the work function of the upper electrode 1 is smaller than that of the lower electrode 3.

Sample (B): Electric element in which the work function of the upper electrode 1 is greater than that of the lower electrode 3.

Sample (C): Electric element in which the work function of the upper electrode 1 is equal to that of the lower electrode 3.

After the formation of sample (A), sample (B) and sample (C), a pulse voltage (voltage value: +3 V, pulse width: 10 μsec) was applied to the state-variable material layer 2 such that the upper electrode 1 became positive (+) with respect to the lower electrode 3, whereby the resistance value of the state-variable material layer 2 was initially set to a resistance value which was lower than the resistance value measured immediately after the formation (about 1 MΩ) by about slightly more than one order of magnitude. (This initialization was carried out according to a method described in Japanese Patent Application No. 2003-421374 (PCT/JP2004/019291), which is incorporated herein by reference.)

<Experiments>

In example 1, we carried out the following experiments on sample (A), sample (B) and sample (C).

[Experiment 1]

Pulse voltages which are to make the upper electrode 1 positive (+) with respect to the lower electrode 3 (hereinafter, referred to as "positive (+) pulse voltage(s)") and pulse voltages which are to make the upper electrode 1 negative (−) with respect to the lower electrode 3 (hereinafter, referred to as "negative (−) pulse voltage(s)") are alternately applied to the state-variable material layer 2 on a one-by-one basis (see FIG. 2). Every time application of one pulse voltage is completed, a voltage which is to make the upper electrode 1 positive (+) with respect to the lower electrode 3 (hereinafter, referred to as "positive (+) measurement voltage") is applied to the state-variable material layer 2 in order to measure the resistance value of the state-variable material layer 2.

[Experiment 2]

Figure 2:
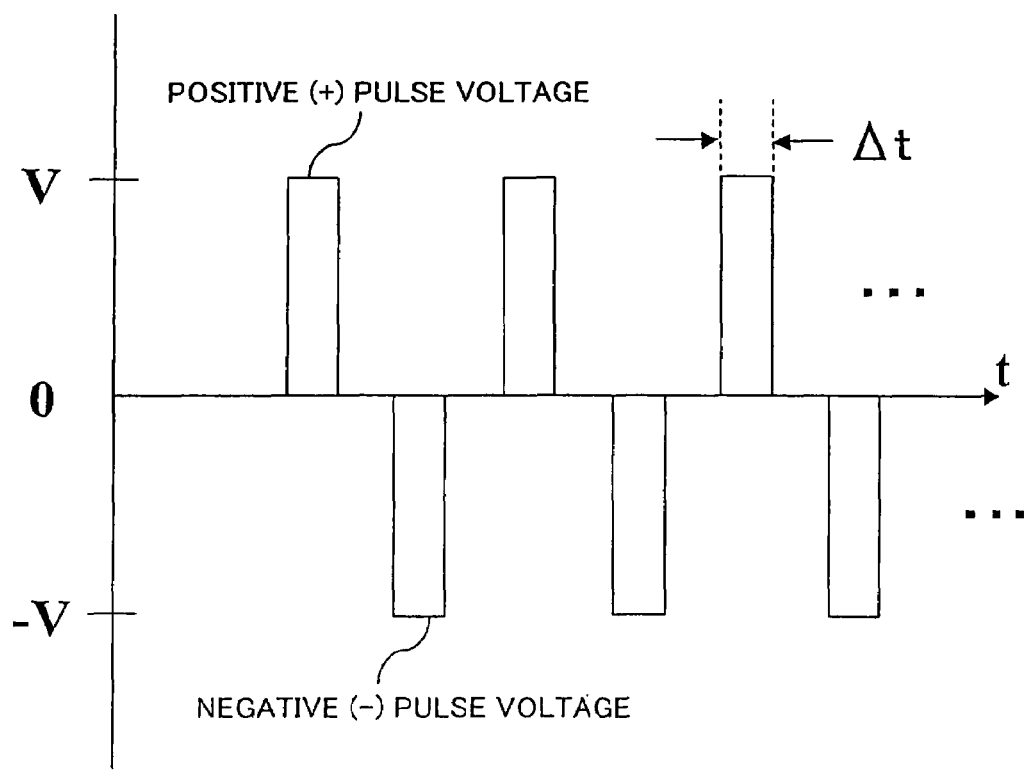
FIG. 2 shows a waveform of a pulse voltage to be applied.

Positive (+) pulse voltages and negative (−) pulse voltages are alternately applied to the state-variable material layer 2 on a one-by-one basis (see FIG. 2). Every time application of one pulse voltage is completed, a voltage which is to make the upper electrode 1 negative (−) with respect to the lower electrode 3 (hereinafter, referred to as "negative (−) measurement voltage") is applied to the state-variable material layer 2 in order to measure the resistance value of the state-variable material layer 2.

[Experiment 3]

Positive (+) pulse voltages and negative (−) pulse voltages are alternately applied to the state-variable material layer 2 on a one-by-one basis (see FIG. 2). Every time application of one pulse voltage is completed, the current-voltage characteristic of the state-variable material layer 2 is measured.

The voltages applied in the above experiments are as follows.

Positive (+) pulse voltage: voltage value: +3 V, pulse width: 50 nsec

Negative (−) pulse voltage: voltage value: −3 V, pulse width: 50 nsec

Positive (+) measurement voltage: voltage value: +0.5 V

Negative (−) measurement voltage: voltage value: −0.5 V

<Experiments on Sample (A)>

Figure 3A:
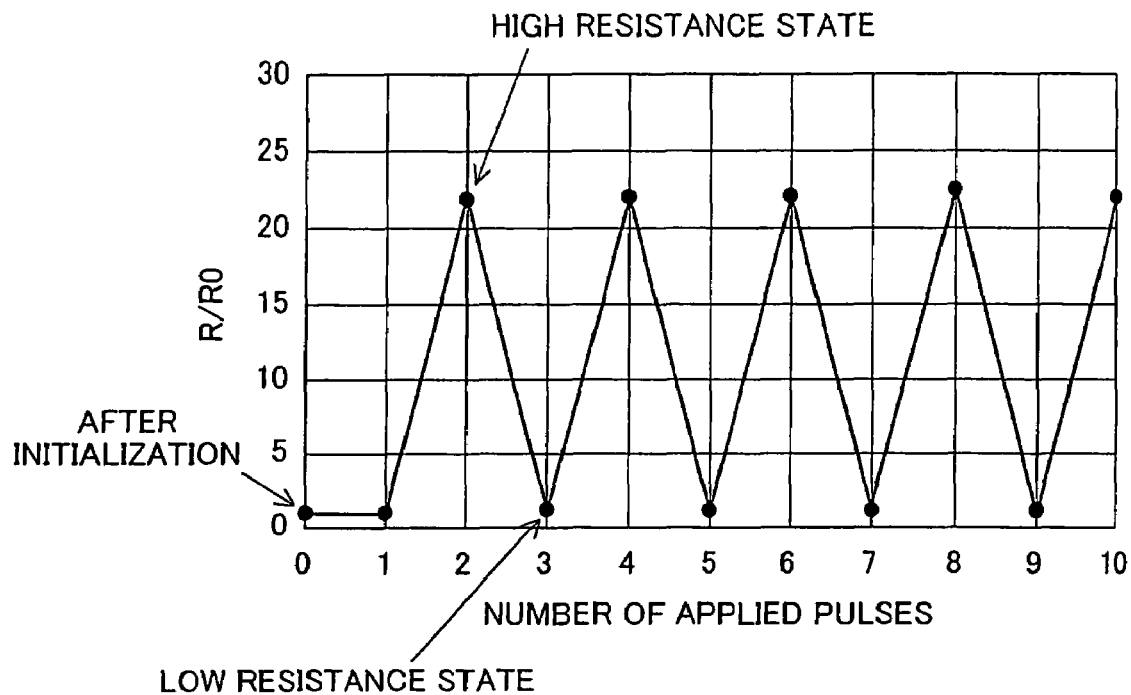
FIG. 3A shows a variation in resistance value which occurs when a pulse voltage of the first polarity is applied to an electric element.
Figure 3B:
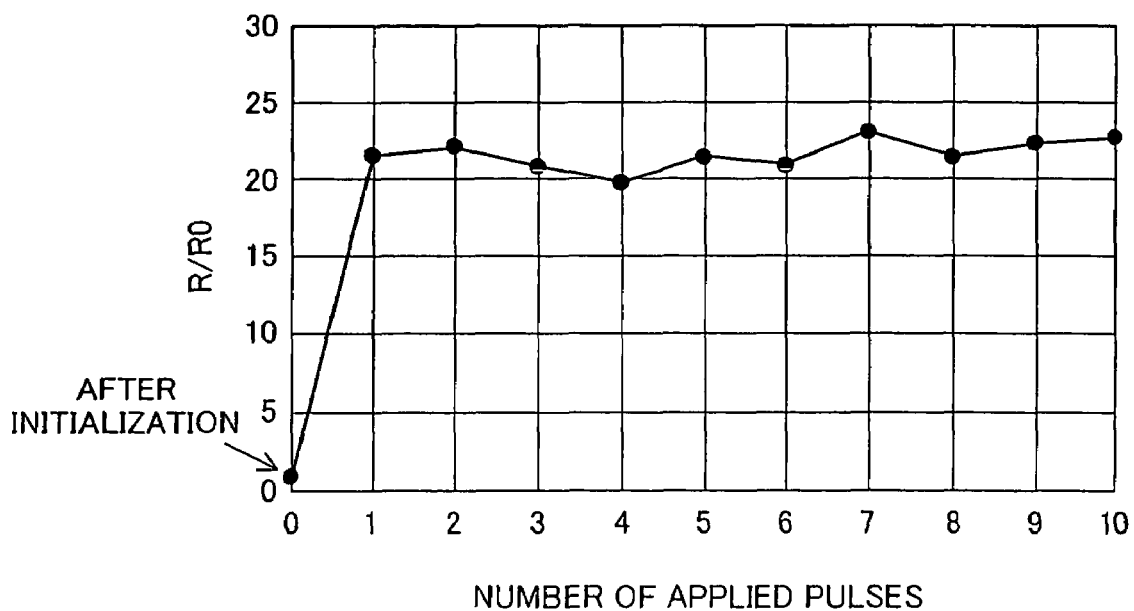
FIG. 3B shows a variation in resistance value which occurs when a pulse voltage of the second polarity is applied to the electric element.

In the first place, experiments on sample (A) are described with reference to FIG. 3A, FIG. 3B, FIG. 4A and FIG. 4B. In FIG. 3A and FIG. 3B, the vertical axis represents a value obtained by normalizing measured value R with resistance value R0 measured immediately after initialization (the same applies to FIG. 6, FIG. 8A, FIG. 8B and FIG. 9).

[Materials Used]

Upper electrode 1: Ag (thickness: about 0.2 μm, work function: 4.3 eV (=electron volts))

State-variable material layer 2: $CuFe_2O_4$ (thickness: about 0.1 μm)

Lower electrode 3: Pt (thickness: about 0.2 μm, work function: 5.7 eV)

[Result of Experiment 1]

Experiment 1 was carried out on sample (A). The experimental result is shown in FIG. 3A. After the application of the positive (+) pulse voltage, the measured value changed from a high resistance state (a state where the resistance value is high as compared with the other state) to a low resistance state (a state where the resistance value is low as compared with the other state). After the application of the negative (−) pulse voltage, the measured value changed from the low resistance state to the high resistance state. Thus, it was found that the resistance value for the direction extending from the upper electrode 1 to the lower electrode 3 (the resistance value of the state-variable material layer 2) increases or decreases according to the applied pulse voltage.

[Result of Experiment 2]

Experiment 2 was carried out on sample (A). The experimental result is shown in FIG. 3B. Even after the application of the positive (+) pulse voltage, the measured value was maintained at the high resistance state. Thus, it was found that the resistance value for the direction extending from the lower electrode 3 to the upper electrode 1 (the resistance value of the state-variable material layer 2) always exhibits the high resistance state irrespective of the applied pulse voltage.

[Result of Experiment 3]

Figure 4A:
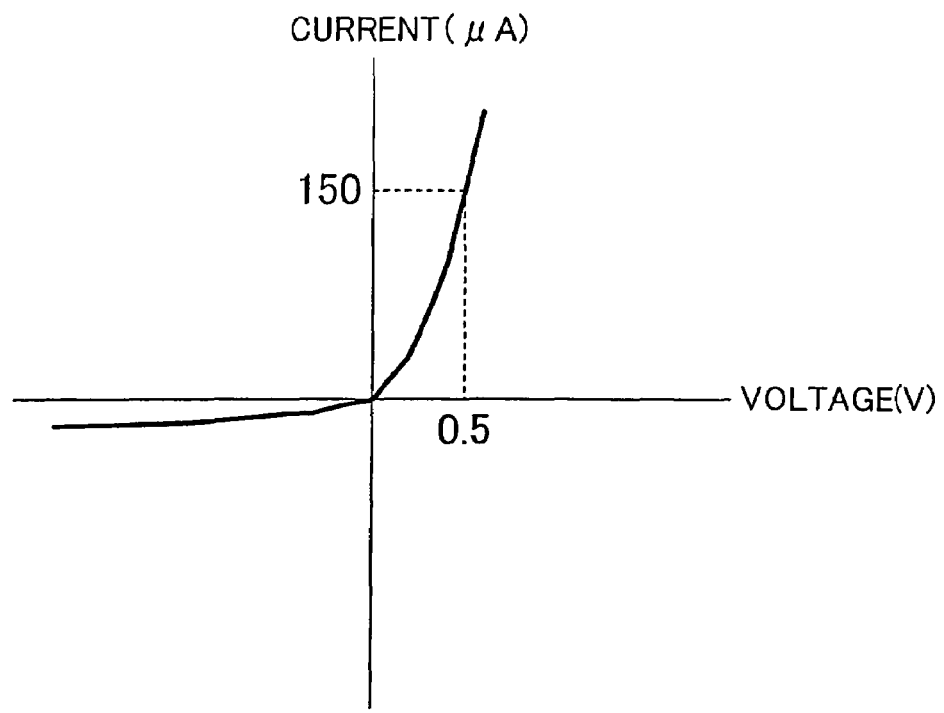
FIG. 4A shows the current-voltage characteristic which occurs when a pulse voltage of the first polarity is applied to an electric element.

Experiment 3 was carried out on sample (A). The current-voltage characteristic measured after the application of the positive (+) pulse voltage is shown in FIG. 4A. As seen from FIG. 4A, after the application of the positive (+) pulse voltage, an electric current readily flowed when the positive (+) measurement voltage was applied, whereas an electric current did not readily flow when the negative (−) measurement voltage was applied. Thus, it was found that, after the application of the positive (+) pulse voltage, an electric current (electric current flowing through the state-variable material layer 2) readily flows in the direction extending from the upper electrode 1 to the lower electrode 3, but the electric current does not readily flow in the direction extending from the lower electrode 3 to the upper electrode 1.

Figure 4B:
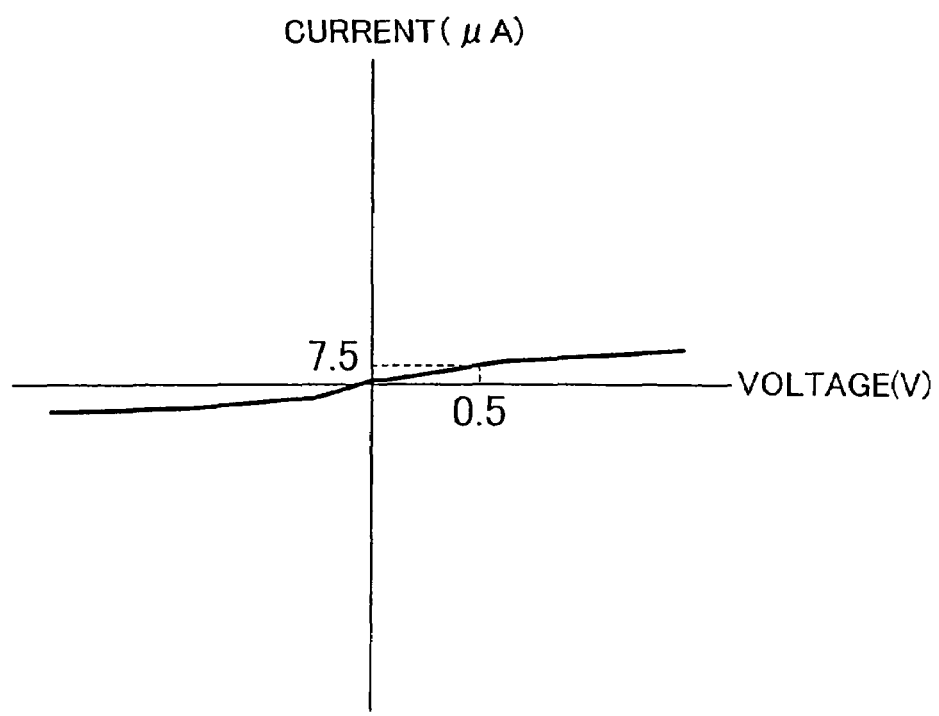
FIG. 4B shows the current-voltage characteristic which occurs when a pulse voltage of the second polarity is applied to the electric element.

The current-voltage characteristic measured after the application of the negative (−) pulse voltage is shown in FIG. 4B. As seen from FIG. 4B, after the application of the negative (−) pulse voltage, the electric current did not readily flow even when the positive (+) measurement voltage was applied. Thus, it was found that, after the application of the negative (−) pulse voltage, the electric current does not readily flow in the direction extending from the upper electrode 1 to the lower electrode 3 as compared with the electric current flowing after the application of the positive (+) pulse voltage.

[Verification Result]

From the above experiments, it was found that sample (A) exhibits the following characteristics.

(1) Diode characteristic such that the direction extending from the upper electrode 1 to the lower electrode 3 is the forward direction, and the direction extending from the lower electrode 3 to the upper electrode 1 is the reverse direction.

(2) Characteristic such that the resistance value for the forward direction increases or decreases according to the applied pulse voltage (variable-resistance characteristic). Specifically, the resistance value for the forward direction decreases in response to the application of the positive (+) pulse voltage but increases in response to the application of the negative (−) pulse voltage.

<Experiments on Sample (B)>

Next, the results of experiments on sample (B) are described with reference to FIG. 3A, FIG. 3B, FIG. 5A and FIG. 5B.

[Materials Used]

Upper electrode 1: Pt (thickness: about 0.2 μm, work function: 5.7 eV)

State-variable material layer 2: $CuFe_2O_4$ (thickness: about 0.1 μm)

Lower electrode 3: Ti (thickness: about 0.2 μm, work function: 4.3 eV)

<Experimental Results>

[Result of Experiment 1]

Experiment 1 was carried out on sample (B). The experimental result was as shown in FIG. 3B. The measured value was maintained at the high resistance state both even after the application of the positive (+) pulse voltage and even after the application of the negative (−) pulse voltage. Thus, it was found that the resistance value for the direction extending from the upper electrode 1 to the lower electrode 3 (the resistance value of the state-variable material layer 2) always exhibits the high resistance state irrespective of the applied pulse voltage.

[Result of Experiment 2]

Experiment 2 was carried out on sample (B). The experimental result was as shown in FIG. 3A. After the application of the positive (+) pulse voltage, the measured value changed from a high resistance state (a state where the resistance value is high as compared with the other state) to a low resistance state (a state where the resistance value is low as compared with the other state). After the application of the negative (−) pulse voltage, the measured value changed from the low resistance state to the high resistance state. Thus, it was found that the resistance value for the direction extending from the lower electrode 3 to the upper electrode 1 (the resistance value of the state-variable material layer 2) increases or decreases according to the applied pulse voltage.

[Result of Experiment 3]

Figure 5A:
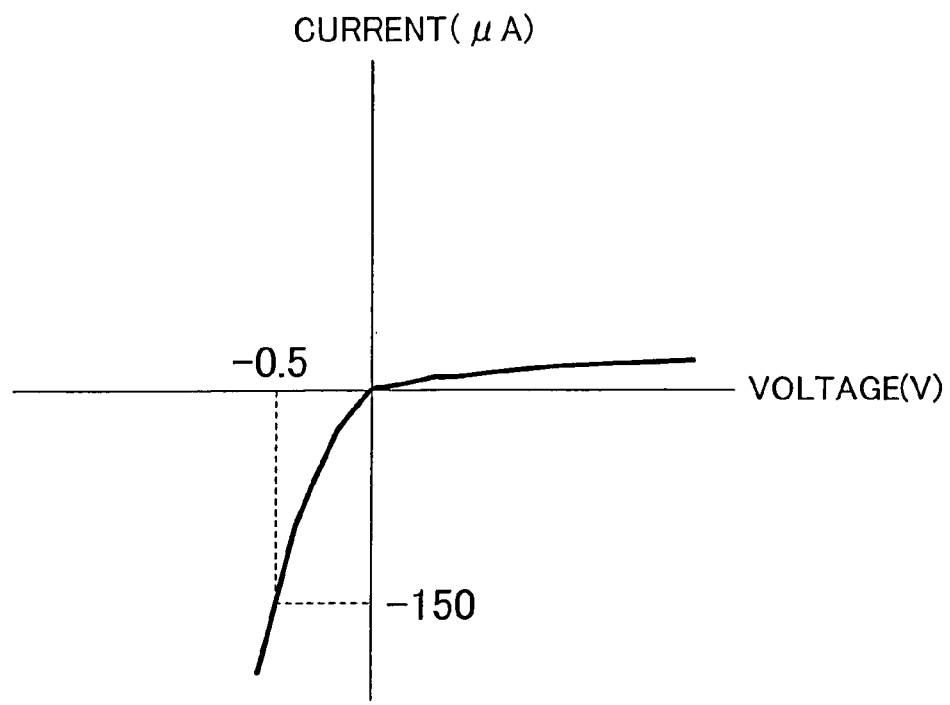
FIG. 5A shows the current-voltage characteristic which occurs when a pulse voltage of the first polarity is applied to an electric element.

Experiment 3 was carried out on sample (B). The current-voltage characteristic measured after the application of the positive (+) pulse voltage is shown in FIG. 5A. As seen from FIG. 5A, after the application of the positive (+) pulse voltage, an electric current did not readily flow when the positive (+) measurement voltage was applied, whereas an electric current readily flowed when the negative (−) measurement voltage was applied. Thus, it was found that, after the application of the positive (+) pulse voltage, an electric current (electric current flowing through the state-variable material layer 2) does not readily flow in the direction extending from the upper electrode 1 to the lower electrode 3, but the electric current readily flows in the direction extending from the lower electrode 3 to the upper electrode 1.

Figure 5B:
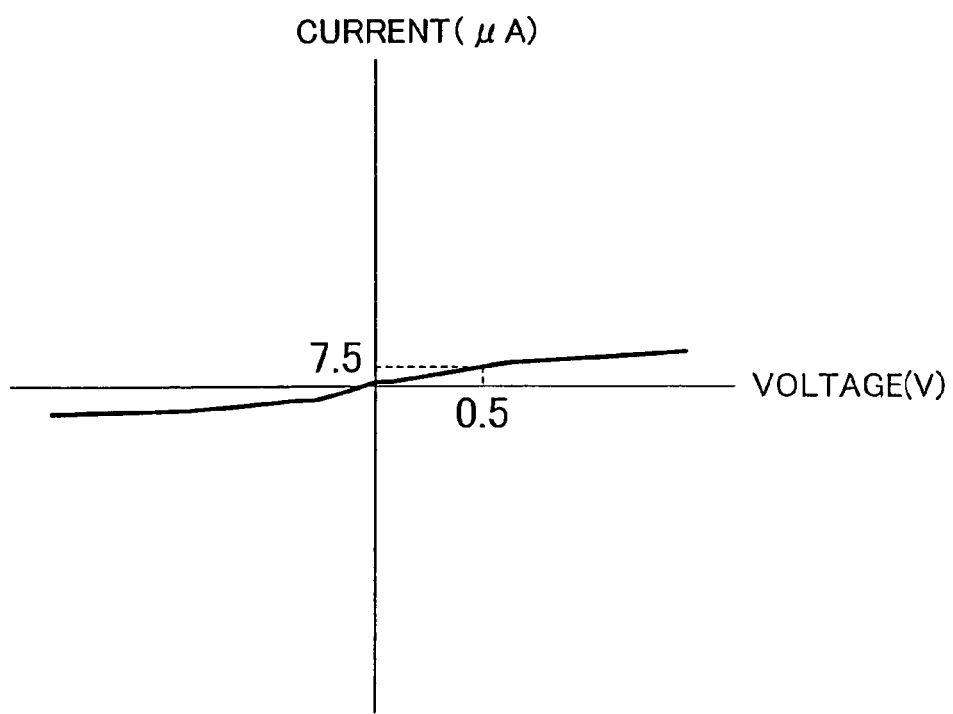
FIG. 5B shows the current-voltage characteristic which occurs when a pulse voltage of the second polarity is applied to the electric element.

The current-voltage characteristic measured after the application of the negative (−) pulse voltage is shown in FIG. 5B. As seen from FIG. 5B, after the application of the negative (−) pulse voltage, the electric current did not readily flow even when the negative (−) measurement voltage was applied. Thus, it was found that, after the application of the negative (−) pulse voltage, the electric current does not readily flow in the direction extending from the lower electrode 3 to the upper electrode 1 as compared with the electric current flowing after the application of the positive (+) pulse voltage.

[Verification Result]

From the above experiments, it was found that sample (B) exhibits the following characteristics.

(1) Diode characteristic such that the direction extending from the lower electrode 3 to the upper electrode 1 is the forward direction, and the direction extending from the upper electrode 1 to the lower electrode 3 is the reverse direction.

(2) Characteristic such that the resistance value for the forward direction increases or decreases according to the applied pulse voltage (variable-resistance characteristic). Specifically, the resistance value for the forward direction decreases in response to the application of the positive (+) pulse voltage but increases in response to the application of the negative (−) pulse voltage.

<Experiments on Sample (C)>

Figure 6:
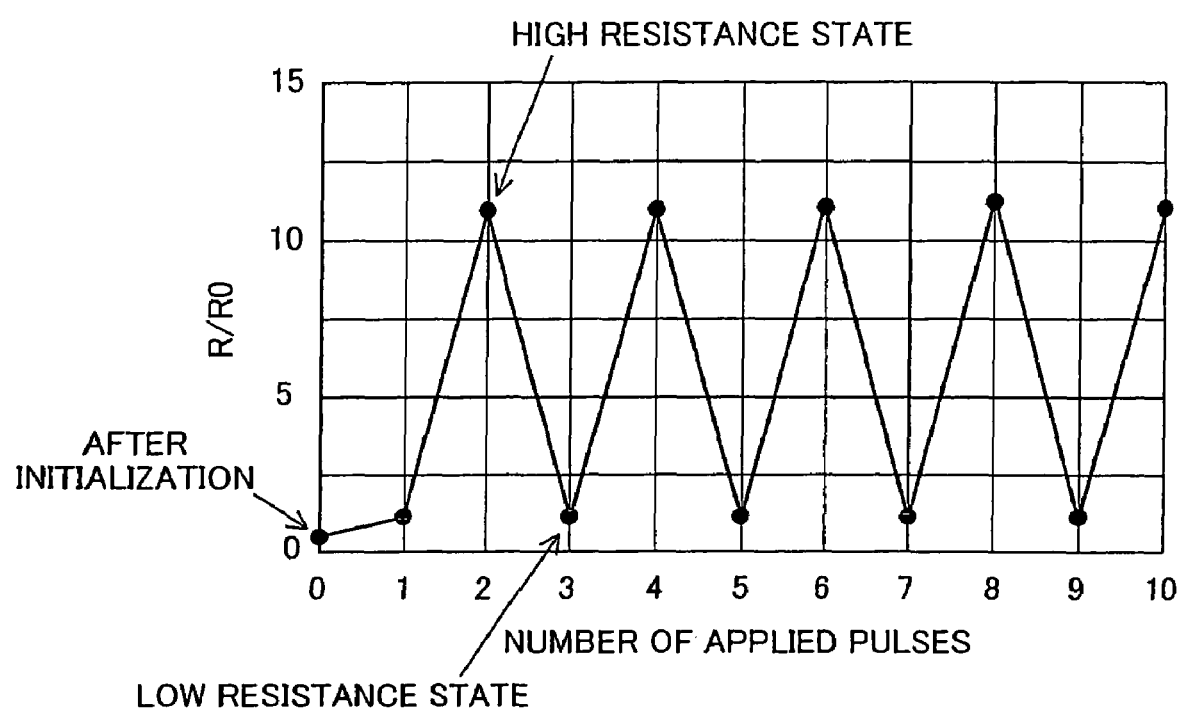
FIG. 6 shows a variation in resistance value which occurs when a pulse voltage is applied to an electric element.
Figure 7A:
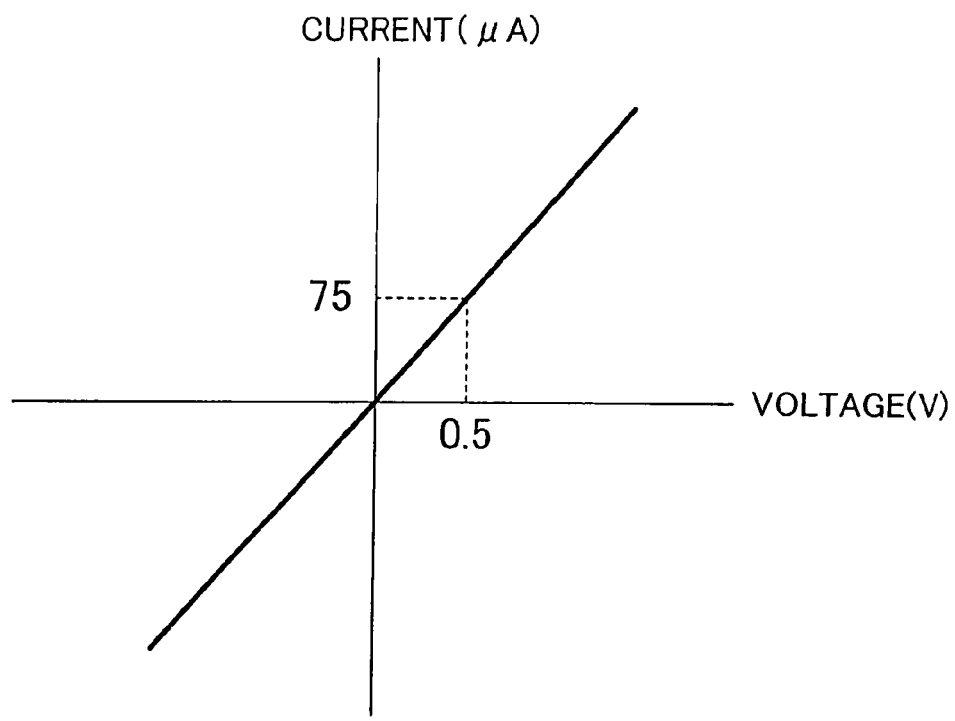
FIG. 7A shows the current-voltage characteristic which occurs when a pulse voltage of the first polarity is applied to an electric element.
Figure 7B:
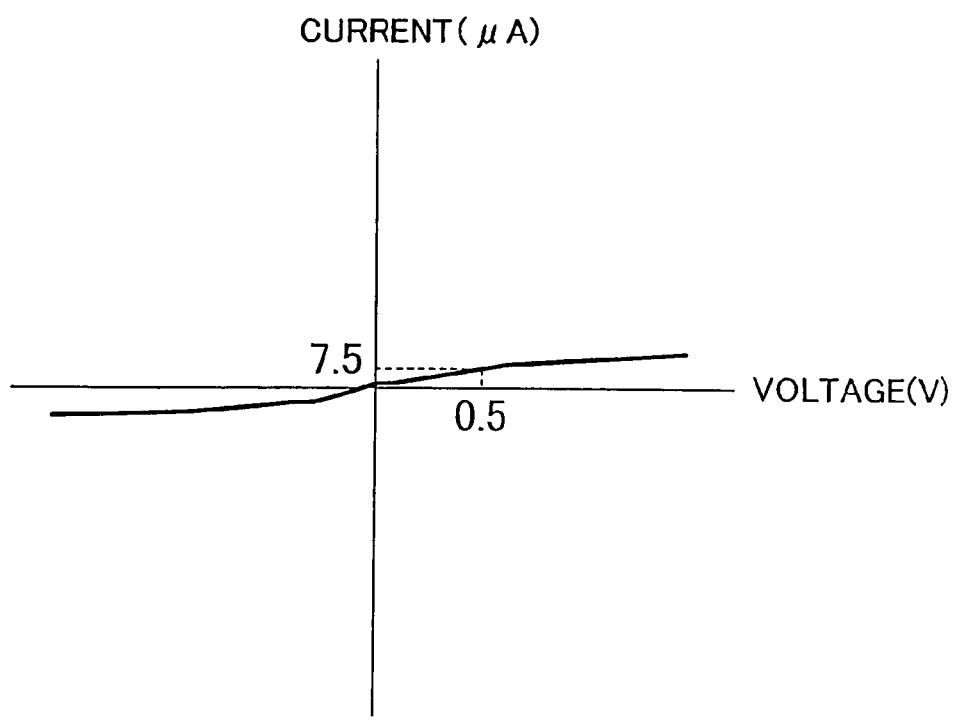
FIG. 7B shows the current-voltage characteristic which occurs when a pulse voltage of the second polarity is applied to the electric element.

Next, the results of experiments on sample (C) are described with reference to FIG. 6, FIG. 7A and FIG. 7B.

[Materials Used]

Upper electrode 1: Pt (thickness: about 0.2 μm, work function: 5.7 eV)

State-variable material layer 2: CuFe$_2$O$_4$ (thickness: about 0.1 μm)

Lower electrode 3: Pt (thickness: about 0.2 μm, work function: 5.7 eV)

<Experimental Results>

[Result of Experiment 1]

Experiment 1 was carried out on sample (C). The experimental result was as shown in FIG. 6. After the application of the positive (+) pulse voltage, the measured value changed from the high resistance state to the low resistance state. After the application of the negative (−) pulse voltage, the measured value changed from the low resistance state to the high resistance state. Thus, the resistance value for the direction extending from the upper electrode 1 to the lower electrode 3 (the resistance value of the state-variable material layer 2) increased or decreased according to the applied pulse voltage.

[Result of Experiment 2]

Experiment 2 was carried out on sample (C). The experimental result was as shown in FIG. 6. As seen from FIG. 6, the resistance value for the direction extending from the lower electrode 3 to the upper electrode 1 (the resistance value of the state-variable material layer 2) increased or decreased according to the applied pulse voltage.

[Result of Experiment 3]

Experiment 3 was carried out on sample (C). The current-voltage characteristic measured after the application of the positive (+) pulse voltage is shown in FIG. 7A, and the current-voltage characteristic measured after the application of the negative (−) pulse voltage is shown in FIG. 7B. Comparing FIG. 7A and FIG. 7B, it was found that the electric current readily flows (the resistance value of the state-variable material layer 2 is small) after the application of the positive (+) pulse voltage rather than after the application of the negative (−) pulse voltage.

[Verification Result]

From the above experiments, it was found that sample (C) exhibits the following characteristic.

(1) Characteristic such that the resistance value decreases in response to the application of the positive (+) pulse voltage but increases in response to the application of the negative (−) pulse voltage (variable-resistance characteristic).

<Conclusion>

In sample (A), the work function of the upper electrode 1 is smaller than that of the lower electrode 3. In sample (B), the work function of the upper electrode 1 is greater than that of the lower electrode 3. From the experimental results of sample (A), sample (B) and sample (C), it was found that the state-variable material layer 2 exhibits the following characteristics.

(1) Diode characteristic such that the direction extending from the electrode having a small work function to the electrode having a large work function is the forward direction, and the direction extending from the electrode having a large work function to the electrode having a small work function is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction decreases. When a pulse voltage is applied between the upper electrode 1 and the lower electrode 3 such that the upper electrode 1 becomes negative (−) with respect to the lower electrode 3, the resistance value for the forward direction increases.

In sample (A), sample (B) and sample (C), a pulse voltage was applied to the state-variable material layer 2 after the formation of each sample such that the upper electrode 1 became positive (+) with respect to the lower electrode 3, whereby the resistance value of the state-variable material layer 2 was initially set to a resistance value which was lower than the resistance value measured immediately after the formation (about 1 MΩ) by about slightly more than one order of magnitude. Meanwhile, we also prepared sample (A'), sample (B') and sample (C'), which are the same as sample (A), sample (B) and sample (C), respectively, except that a pulse voltage (voltage value: −3 V, pulse width: 10 μsec) was applied to the state-variable material layer 2 after the formation of each sample such that the upper electrode 1 became negative (−) with respect to the lower electrode 3, whereby the resistance value of the state-variable material layer 2 was initially set to a resistance value which was lower than the resistance value measured immediately after the formation (about 1 MΩ) by about slightly more than one order of magnitude.

The above-described experiments performed on sample (A), sample (B) and sample (C) (experiments 1-3) were also carried out on sample (A'), sample (B') and sample (C').

<Experiments on Sample (A')>

Experiments on sample (A') are described with reference to FIG. 8A, FIG. 8B, FIG. 4A and FIG. 4B.

[Result of Experiment 1]

Figure 8A:
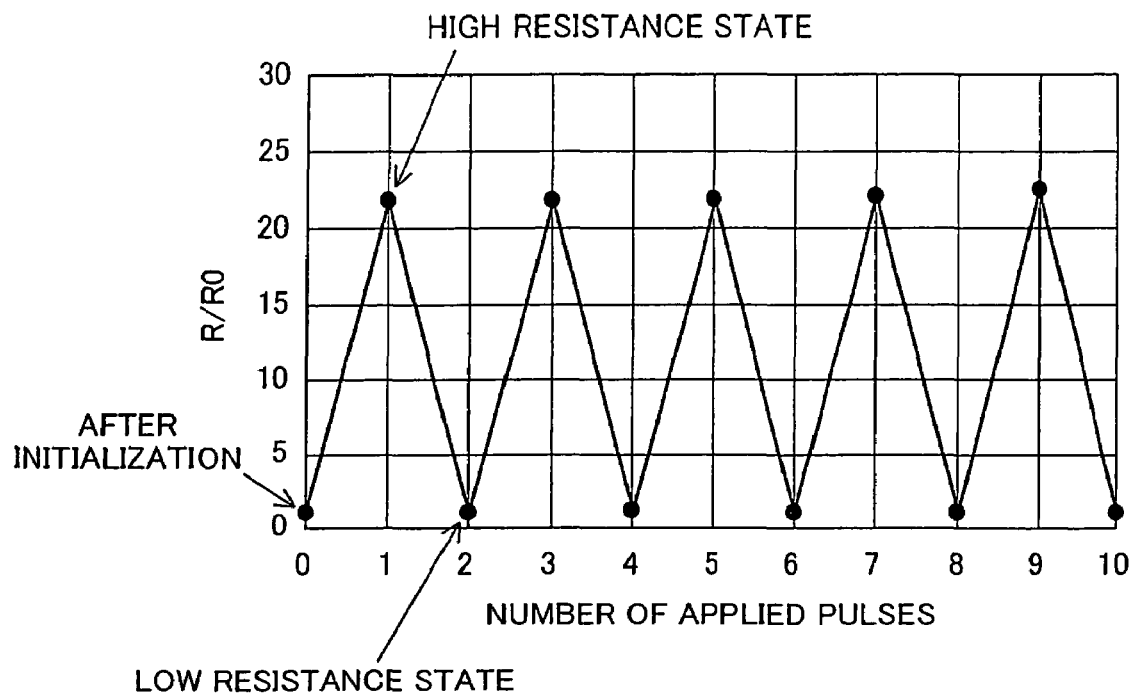
FIG. 8A shows a variation in resistance value which occurs when a pulse voltage of the first polarity is applied to an electric element.

The result of experiment 1 on sample (A') was as shown in FIG. 8A. After the application of the positive (+) pulse voltage, the measured value changed from the low resistance state to the high resistance state. After the application of the negative (−) pulse voltage, the measured value changed from the high resistance state to the low resistance state. Thus, it was found that the resistance value for the direction extending from the upper electrode 1 to the lower electrode 3 (the resistance value of the state-variable material layer 2) increases or decreases according to the applied pulse voltage.

[Result of Experiment 2]

Figure 8B:
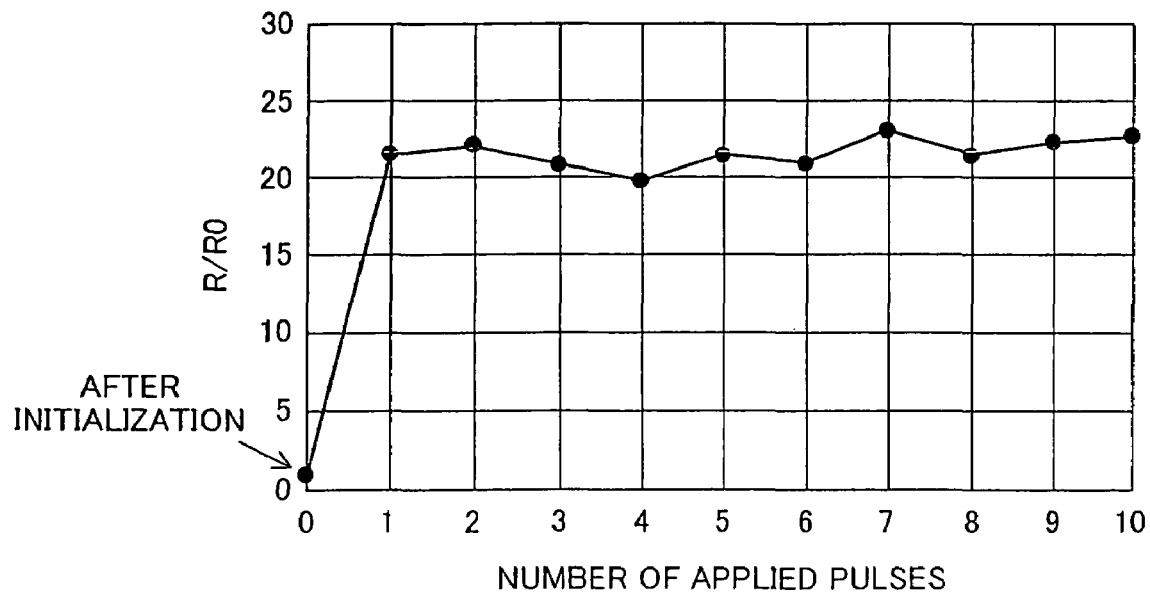
FIG. 8B shows a variation in resistance value which occurs when a pulse voltage of the second polarity is applied to the electric element.

The result of experiment 2 on sample (A') was as shown in FIG. 8B. Even after the application of the negative (−) pulse voltage, the measured value was maintained at the high resistance state. Thus, it was found that the resistance value for the direction extending from the lower electrode 3 to the upper electrode 1 always exhibits the high resistance state irrespective of the applied pulse voltage.

[Result of Experiment 3]

The result of experiment 3 on sample (A') is now described. The current-voltage characteristic measured after the application of the positive (+) pulse voltage was as shown in FIG. 4B. The current-voltage characteristic measured after the application of the negative (−) pulse voltage was as shown in FIG. 4A.

<Experiments on Sample (B')>

The results of experiments on sample (B') are described with reference to FIG. 8A, FIG. 8B, FIG. 5A and FIG. 5B.

[Result of Experiment 1]

The result of experiment 1 on sample (B') was as shown in FIG. 8B. Thus, it was found that the resistance value for the direction extending from the upper electrode 1 to the lower electrode 3 always exhibits the high resistance state irrespective of the applied pulse voltage.

[Result of Experiment 2]

The result of experiment 2 on sample (B') was as shown in FIG. 8A. Thus, it was found that the resistance value for the direction extending from the lower electrode 3 to the upper electrode 1 increases or decreases according to the applied pulse voltage.

[Result of Experiment 3]

The result of experiment 3 on sample (B') is now described. The current-voltage characteristic measured after the application of the positive (+) pulse voltage was as shown in FIG. 5B. The current-voltage characteristic measured after the application of the negative (−) pulse voltage was as shown in FIG. 5A.

<Experiments on Sample (C')>

[Results of Experiment 1 and Experiment 2]

Figure 9:
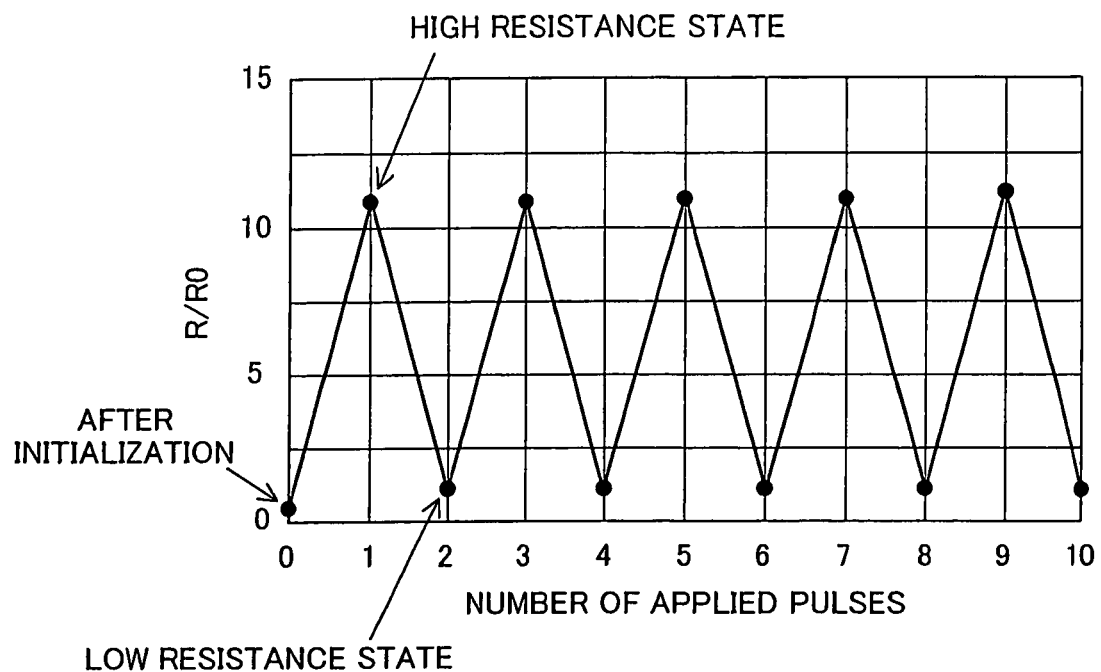
FIG. 9 shows a variation in resistance value which occurs when a pulse voltage is applied to an electric element.

The results of experiment 1 and experiment 2 on sample (C') were as shown in FIG. 9. Thus, it was found that both the resistance value for the direction extending from the upper electrode 1 to the lower electrode 3 and the resistance value for the direction extending from the lower electrode 3 to the upper electrode 1 increases or decreases according to the applied pulse voltage.

[Result of Experiment 3]

The result of experiment 3 on sample (C') is now described. The current-voltage characteristic measured after the application of the positive (+) pulse voltage was as shown in FIG. 7B. The current-voltage characteristic measured after the application of the negative (−) pulse voltage was as shown in FIG. 7A.

<Conclusion>

From the experimental results of sample (A'), sample (B') and sample (C'), it was found that the state-variable material layer 2 exhibits the following characteristics.

(1) Diode characteristic such that the direction extending from the electrode having a small work function to the electrode having a large work function is the forward direction, and the direction extending from the electrode having a large work function to the electrode having a small work function is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction increases. When a pulse voltage is applied between the upper electrode 1 and the lower electrode 3 such that the upper electrode 1 becomes negative (−) with respect to the lower electrode 3, the resistance value for the forward direction decreases.

From the above-described experimental results of the above samples (samples (A) to (C) and samples (A') to (C')), it was found that the state-variable material layer 2 exhibits the following characteristics.

(1) Diode characteristic such that, where the work functions of the upper electrode 1 and the lower electrode 3 are different from each other, the direction extending from one electrode to the other electrode (first direction) is the forward direction, and the direction extending from the other electrode to the one electrode is the reverse direction (second direction, which is opposite to the first direction).

(2) Characteristic such that the resistance value for the forward direction of the diode characteristic increases or decreases when a predetermined pulse voltage is applied (variable-resistance characteristic).

Further, it was confirmed as to the pulse voltage applied for the purpose of changing the resistance value that the pulse width of the pulse voltage of example 1 (50 nsec) is shorter than the pulse width of the pulse voltage of the conventional example (1 µsec or longer).

Confirming the above-described characteristics, the electric element of FIG. 1 was produced using two types of materials having different work functions for the upper electrode 1 and the lower electrode 3.

EXAMPLE 2

To realize the state-variable material layer 2 having the above-described characteristics (variable-resistance characteristic and diode characteristic), a state-variable material which has nonuniform crystallinity is used for the state-variable material layer 2 in the electric element of FIG. 1. The reasons therefor are described below.

<Crystallinity of State-Variable Material>

[State-Variable Material Layer Formation Method 1]

The temperature of the substrate 4 on which the lower electrode 3 has been formed was increased to the vicinity of the crystallization temperature of a state-variable material used for the layer 2 (e.g., about 600° C. for $CuFe_2O_4$) to form the state-variable material layer 2. The thus-formed state-variable material layer 2 was subjected to an X-ray diffraction analysis to examine distortion of the crystalline structure, and as a result, it was found that the state-variable material layer 2 exhibits a sharp diffraction peak (a diffraction peak having a large intensity) at a position which indicates crystal interplanar spacing D. That is, it was found that the crystallinity of the thus-formed state-variable material layer 2 is basically uniform in the film thickness direction.

[State-Variable Material Layer Formation Method 2]

The state-variable material layer 2 was formed while the temperature of the substrate 4 on which the lower electrode 3 has been formed was not increased to the vicinity of the crystallization temperature of a state-variable material used for the layer 2. The thus-formed state-variable material layer 2 was subjected to an X-ray diffraction analysis to examine distortion of the crystalline structure, and as a result, it was found that the crystalline structure of the state-variable material layer 2 has irregular interplanar spacings (i.e., the state-variable material layer 2 exhibits a broader diffraction peak having a small intensity). That is, it was found that the thus-formed state-variable material layer 2 has a distortion of the crystalline structure.

[State-Variable Material Layer Formation Method 3]

The state-variable material layer 2 was formed while the temperature of the substrate 4 on which the lower electrode 3 has been formed was gradually decreased from about 600° C. Then, the upper electrode 1 was formed on the state-variable material layer 2. The thus-formed state-variable material layer 2 was subjected to an electron diffraction analysis with a transmission electron microscope. As a result, an electron diffraction pattern (a spot pattern at a certain cycle) which shows an excellent crystallinity was observed in a portion of the state-variable material layer 2 in the vicinity of the lower electrode 3, whereas an electron diffraction pattern (halo pattern) which shows a poor crystallinity (near amorphous) was observed in a portion of the state-variable material layer 2 in the vicinity of the upper electrode 1. That is, in the state-variable material layer 2, the crystal interplanar spacing exhibited a substantially-uniform value in the vicinity of the lower electrode 3. Thus, it was found that the state-variable material layer 2 has an excellent crystallinity with a small distortion of the crystalline structure in the vicinity of the lower electrode 3. On the other hand, in the vicinity of the upper electrode 1, the state-variable material layer 2 exhibited a distribution in which the crystal interplanar spacing was irregular as compared with the vicinity of the lower electrode 3. Thus, it was found that the state-variable material layer 2 has a poor crystallinity with a large distortion of the crystalline structure in the vicinity of the upper electrode 1.

Further, the state-variable material layer 2 was subjected to a cross-sectional TEM observation with a transmission electron microscope to measure the grain size of the state-variable material layer 2. The grain size of the state-variable material layer 2 in the vicinity of the lower electrode 3 was twice or more as large as that of the state-variable material layer 2 in the vicinity of the upper electrode 1. Therefore, it was confirmed that the state-variable material layer 2 has an excellent crystallinity in the vicinity of the lower electrode 3 rather than in the vicinity of the upper electrode 1.

From the above, it was found that, when the state-variable material layer 2 is formed while the temperature of the substrate 4 on which the lower electrode 3 has been formed is gradually decreased from about 600° C., the state-variable material layer 2 results in nonuniform crystallinity in which the crystallinity is excellent in the vicinity of the lower electrode 3 but poor in the vicinity of the upper electrode 1.

<Experiment on Sample (D)>

The state-variable material layer 2 was formed on the lower electrode 3 according to the above-described state-variable material layer formation method 3, and the upper electrode 1 was formed on the state-variable material layer 2, whereby sample (D) was produced.

[Sample (D)]

Upper electrode 1: Pt (thickness: about 0.2 μm, work function: 5.7 eV)

State-variable material layer 2: $CuFe_2O_4$ (thickness: about 0.1 μm)

Lower electrode 3: Pt (thickness: about 0.2 μm, work function: 5.7 eV)

It should be noted that, after the formation of sample (D), a pulse voltage (voltage value: +3 V, pulse width: 10 μsec) was applied to the state-variable material layer 2 such that the upper electrode 1 became positive (+) with respect to the lower electrode 3, whereby the resistance value of the state-variable material layer 2 was initialized to a resistance value which was lower than the resistance value measured immediately after the formation (about 1 MΩ) by about slightly more than one order of magnitude.

[Experiments 1-3]

The above-described experiments of example 1 (experiments 1-3) were performed on sample (D). The results thereof were the same as those of sample (A) of example 1 (see FIG. 3A, FIG. 3B, FIG. 4A and FIG. 4B). From the experimental result of sample (D), it was found that the state-variable material layer 2 exhibits the following characteristics.

(1) Diode characteristic such that the direction extending from the poor crystallinity region to the excellent crystallinity region is the forward direction, and the direction extending from the excellent crystallinity region to the poor crystallinity region is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction decreases. When a pulse voltage is applied between the upper electrode 1 and the lower electrode 3 such that the upper electrode 1 becomes negative (−) with respect to the lower electrode 3, the resistance value for the forward direction increases.

Meanwhile, we also prepared sample (D'), which is the same as sample (D) except that a pulse voltage (voltage value: −3 V, pulse width: 10 μsec) was applied to the state-variable material layer 2 after the formation of the sample such that the upper electrode 1 became negative (−) with respect to the lower electrode 3, whereby the resistance value of the state-variable material layer 2 was initialized to a resistance value which was lower than the resistance value measured immediately after the formation (about 1 MΩ) by about slightly more than one order of magnitude.

The above-described experiments performed on sample (D) (experiments 1-3) are also carried out on sample (D').

<Experiments on Sample (D')>

The result of experiment 1 on sample (D') was as shown in FIG. 8A. The result of experiment 2 on sample (D') was as shown in FIG. 8B. Further, it was confirmed that the result of experiment 3 on sample (D') (current-voltage characteristic) was as shown in FIG. 4B after the application of the positive (+) pulse voltage but was as shown in FIG. 4A after the application of the negative (−) pulse voltage. From the experimental results of sample (D'), it was found that the state-variable material layer 2 exhibits the following characteristics.

(1) Diode characteristic such that the direction extending from the poor crystallinity region to the excellent crystallinity region is the forward direction, and the direction extending from the excellent crystallinity region to the poor crystallinity region is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction increases. When a pulse voltage is applied between the upper electrode 1 and the lower electrode 3 such that the upper electrode 1 becomes negative (−) with respect to the lower electrode 3, the resistance value for the forward direction decreases.

From the above-described experimental results of the above samples (sample (D) and sample (D')), it was found that the state-variable material layer 2 exhibits the following characteristics.

(1) Diode characteristic such that, where the crystallinity of the state-variable material layer 2 is not uniform, the direction extending from one electrode to the other electrode (first direction) is the forward direction, and the direction extending from the other electrode to the one electrode is the reverse direction (second direction, which is opposite to the first direction).

(2) Characteristic such that the resistance value for the forward direction of the diode characteristic is increased or decreased when a predetermined pulse voltage is applied (variable-resistance characteristic).

Further, it was confirmed as to the pulse voltage applied for the purpose of changing the resistance value that the pulse width of the pulse voltage of example 2 (50 nsec) is shorter than the pulse width of the pulse voltage of the conventional example (1 μsec or longer).

Confirming the above-described characteristics, the electric element of FIG. 1 was produced using a state-variable material of nonuniform crystallinity for the state-variable material layer 2.

In example 1 and example 2, $CuFe_2O_4$, which is a metal oxide material of a spinel structure, was used for the state-variable material layer 2, but the present invention is not limited thereto. We confirmed that the above-described characteristics can be realized with any of another metal oxide material having a spinel structure, a ferroelectric oxide including an ilmenite structure metal added thereto, a perovskite structure CMR material and a high-temperature superconductor material. Specifically, it was confirmed that the above-described characteristics can be realized with, for example, $CoFe_2O_4$, $NiCr_2O_4$, $Fe_3O_4$, Cr—$SrTiO_3$, Sr—$LiNbO_3$, Mg—$LiNbO_3$, $Pr_{(1-X)}Ca_XMnO_3$, $LaSrMnO_3$, or $GdBaCo_XO_Y$.

Other electrode materials may be used for the upper electrode 1 and the lower electrode 3.

Embodiment 1

<Definition of Graphical Symbol>

Figure 10:
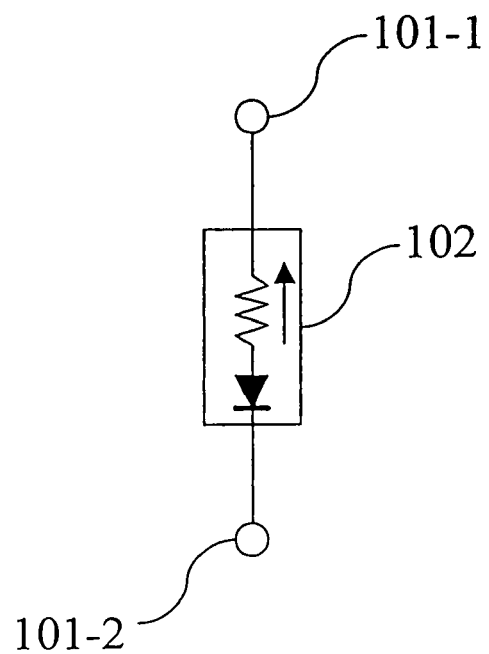
FIG. 10 shows a graphical symbol of an electric element.

An electric element of embodiment 1 of the present invention is described. We define the graphical symbol of the electric element of embodiment 1 as shown in FIG. 10. In the electric element 102 shown in FIG. 10, when a pulse voltage is applied between a terminal 101-1 and a terminal 101-2 such that the terminal 101-1 becomes positive (+) with respect to the terminal 101-2, the resistance value of the electric element 102 decreases. When a pulse voltage is applied between the terminal 101-1 and the terminal 101-2 such that the terminal 101-1 becomes negative (−) with respect to the terminal 101-2, the resistance value of the electric element 102 increases. Further, the electric element 102 shown in FIG. 10 exhibits a diode characteristic such that the direction extending from the terminal 101-1 to the terminal 101-2 is "forward direction" and the direction extending from the terminal 101-2 to the terminal 101-1 is "reverse direction".

<Operation>

Next, the operation of the electric element 102 shown in FIG. 10 is described. Herein, the electric element 102 is used as a memory to perform a process of 1-bit data. It is assumed that the resistance value of the electric element 102 (the resistance value of the state-variable material layer 2) is initialized to a high resistance state. It is further assumed that when the resistance value of the electric element 102 is at "high resistance state", the logical value is "0". When the resistance value of the electric element 102 is at "low resistance state", the logical value is "1".

[Memorization]

To write 1-bit data representing "1" in the electric element 102, the terminal 101-2 is pulled down to the ground, and a memorization voltage is applied to the terminal 101-1. The memorization voltage is, for example, a pulse voltage (positive (+) pulse voltage) which has a voltage value of +3 V and a pulse width of 50 nsec. Since the positive (+) pulse voltage is applied to the electric element 102, the resistance value of the electric element 102 (the resistance value of the state-variable material) results in the low resistance state. In this way, 1-bit data representing "1" is stored in the electric element 102.

[Reset]

To reset the memory state of the electric element 102 to the initial state, the terminal 101-2 is pulled down to the ground, and a reset voltage is applied to the terminal 101-1. The reset voltage is, for example, a pulse voltage (negative (−) pulse voltage) which has a voltage value of −3 V and a pulse width of 50 nsec. Since the negative (−) pulse voltage is applied to the electric element 102, the resistance value of the electric element 102 returns to the high resistance state. In this way, the memory state of the electric element 102 is returned to the initial state.

[Reproduction]

To read data from the electric element 102, the terminal 101-2 is pulled down to the ground, and a reproduction voltage is applied to the terminal 101-1. The reproduction voltage is, for example, a voltage which has a voltage value of +0.5 V. Since the reproduction voltage (=positive (+) measurement voltage) is applied to the electric element 102, an electric current which has an electric value determined according to the resistance value of the electric element 102 flows from the terminal 101-1 to the terminal 101-2 (forward direction). Assuming herein that an electric current which flows when the resistance value of the electric element 102 exhibits "high resistance state" corresponds to "0" and an electric current which flows when the resistance value of the electric element 102 exhibits "low resistance state" corresponds to "1", the above current flow means reproduction of 1-bit data memorized in the electric element 102.

Thus, as described above, the electric element 102 can be used as a memory.

<Effects>

As described above, since the electric element has the "diode characteristic", the direction of the electric current can be defined without using a diode element therefor. Further, the electric element has the "variable-resistance characteristic" and therefore can be used as, for example, a 1R1D nonvolatile memory. In such a use, it is not necessary to provide a diode, and therefore, the production process is simplified, as compared with a conventional 1R1D nonvolatile memory.

Since a diode is not provided, the polarity of a pulse voltage to be applied to the variable-resistance material is not restricted. Therefore, both a pulse voltage of positive (+) polarity and a pulse voltage of negative (−) polarity can be applied to the state-variable material layer. In such a pulse application method (wherein the resistance value is changed according to the polarity of the pulse voltage), the pulse width of a pulse voltage applied is short (50 nsec in embodiment 1) as compared with a conventional pulse application method (wherein the resistance value of the variable-resistance material is changed by adjusting the pulse width of the pulse voltage). That is, the time required for memorization or reset can be shortened.

According to embodiment 1, the above-described effects can also be achieved when any of the following materials is used for the state-variable material layer 2 of the electric element 102: $CuFe_2O_4$, $CoFe_2O_4$, $NiCr_2O_4$, and $Fe_3O_4$, which have a spinel structure, a ferroelectric oxide including an ilmenite structure metal added thereto, a perovskite structure CMR material, a high-temperature superconductor material, etc. Specifically, the above-described effects can also be achieved with Cr—$SrTiO_3$, Sr—$LiNbO_3$, Mg—$LiNbO_3$, $Pr_{(1-X)}Ca_XMnO_3$, $LaSrMnO_3$, $GdBaCo_XO_Y$, or the like.

In CMOS process, it is desirable that the film formation temperature is 450° C. or lower for the purpose of avoiding a high-temperature collapse, or the like. To form a film of a perovskite structure material, it is in general necessary to set the substrate temperature at 700° C. or higher. On the other hand, to form a film of a spinel structure material, a substrate temperature of about 400° C. is sufficient. Thus, when a spinel structure material is used for the state-variable material layer 2 of FIG. 1, the film formation temperature can be set at a low temperature. Therefore, a spinel structure material has better conformity to the semiconductor process than a perovskite structure material.

In general, the high-temperature superconductor material and the CMR material are oxides containing an alkali metal and/or alkaline-earth metal. When the electric element of FIG. 1 is formed using such a material, an alkali metal and/or alkaline-earth metal dissolved out at a washing step of the semiconductor process, and therefore, the characteristics of the electric element as a memory device are deteriorated. To prevent the characteristic deterioration, it is preferable that a material not containing an alkali metal or alkaline-earth metal is used for the state-variable material layer 2.

In embodiment 1, 1-bit data is represented by the two different states, the high resistance state and the low resistance state, whereby the electric element is used as a memory. However, the electric element may be used as a nonvolatile memory device wherein the width and amplitude of an electric pulse are changed to create 4 or more resistance states, whereby 2-bit or 3 or more-bit information is stored.

Embodiment 2

<General Structure>

Figure 11:
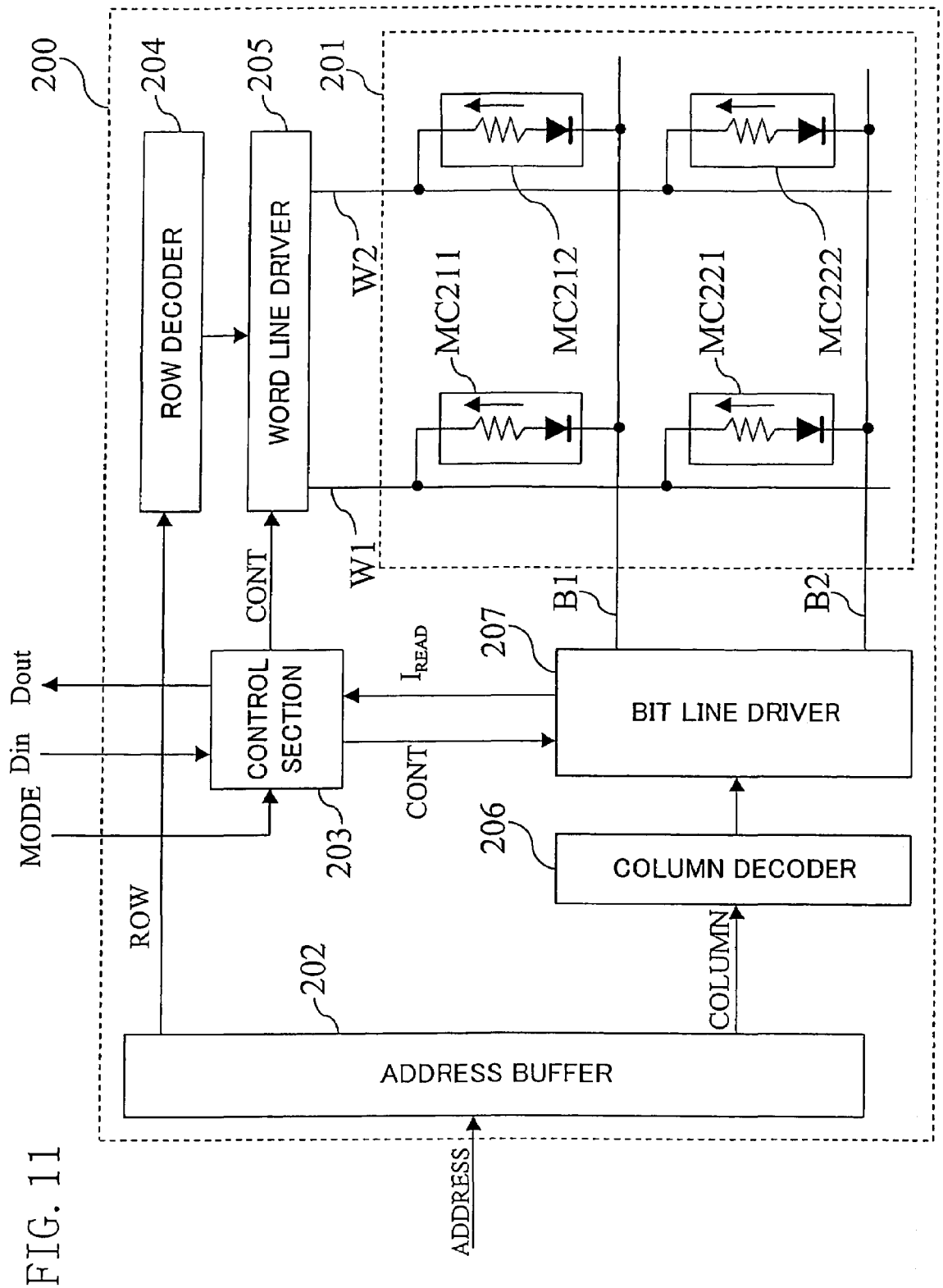
FIG. 11 shows a general structure of a memory device according to embodiment 2 of the present invention.

The general structure of a memory device 200 according to embodiment 2 of the present invention is shown in FIG. 11. The memory device 200 includes a memory array 201, an address buffer 202, a control section 203, a row decoder 204, a word line driver 205, a column decoder 206, and a bit line driver 207.

The memory array 201 includes word lines W1 and W2, bit lines B1 and B2, and memory cells MC211, MC212, MC221 and MC222. Each of the memory cells MC211, MC212, MC221 and MC222 is the electric element 102 shown in FIG. 10. One end of the memory cell MC211 is connected to the word line W1, and the other end of the memory cell MC211 is connected to the bit line B1 (forward direction: W1→B1). One end of the memory cell MC212 is connected to the word line W2, and the other end of the memory cell MC212 is connected to the bit line B1 (forward direction: W2→B1). One end of the memory cell MC221 is connected to the word line W1, and the other end of the memory cell MC221 is connected to the bit line B2 (forward direction: W1→B2). One end of the memory cell MC222 is connected to the word line W2, and the other end of the memory cell MC222 is connected to the bit line B2 (forward direction: W2→B2).

The address buffer 202 receives address signal ADDRESS supplied from the outside of the memory device 200 to output row address signal ROW to the row decoder 204 and output column address signal COLUMN to the column decoder 206. Address signal ADDRESS indicates an address of a memory cell selected from the memory cells MC211, MC212, MC221 and MC222. Row address signal ROW indicates the row address of the address indicated by address signal ADDRESS. Column address signal COLUMN indicates the column address of the address indicated by address signal ADDRESS.

The control section 203 enters any one of memorization mode, reset mode, and reproduction mode according to mode selection signal MODE supplied from the outside of the memory device 200. In the memorization mode, the control section 203 outputs a control signal CONT which indicates "application of memorization voltage" to the word line driver 205 and the bit line driver 207 according to input data Din supplied from the outside of the memory device 200. In the reproduction mode, the control section 203 outputs a control signal CONT which indicates "application of reproduction voltage" to the word line driver 205 and the bit line driver 207. In the reproduction mode, the control section 203 outputs output data Dout indicative of a bit value which is determined according to signal $I_{READ}$ received from the bit line driver 207 to an external device. Signal $I_{READ}$ indicates the current value of an electric current flowing through the bit line B1 or B2. In the reset mode, the control section 203 checks the memory state of the memory cells MC211, MC212, MC221 and MC222 and outputs a control signal CONT which indicates "application of reset voltage" to the word line driver 205 and the bit line driver 207 according to the checked memory state.

The row decoder 204 selects any one of the word lines W1 and W2 according to row address signal ROW received from the address buffer 202.

When receiving the control signal CONT which indicates "application of memorization voltage" from the control section 203, the word line driver 205 applies memorization voltage $V1_{WRITE}$ to a word line selected by the row decoder 204. When receiving the control signal CONT which indicates "application of reproduction voltage" from the control section 203, the word line driver 205 applies reproduction voltage $V1_{READ}$ to a word line selected by the row decoder 204. When receiving the control signal CONT which indicates "application of reset voltage" from the control section 203, the word line driver 205 applies reset voltage $V1_{RESET}$ to a word line selected by the row decoder 204.

The column decoder 206 selects any one of the bit lines B1 and B2 according to column address signal COLUMN received from the address buffer 202.

When receiving the control signal CONT which indicates "application of memorization voltage" from the control section 203, the bit line driver 207 applies memorization voltage $V2_{WRITE}$ to a word line selected by the column decoder 206. When receiving the control signal CONT which indicates "application of reproduction voltage" from the control section 203, the bit line driver 207 applies reproduction voltage $V2_{READ}$ to bit lines which are not selected by the column decoder 206 and then outputs to the control section 203 signal $I_{READ}$ which indicates the current value of an electric current flowing through the bit line B1 or B2. When receiving the control signal CONT which indicates "application of reset voltage" from the control section 203, the bit line driver 207 applies reset voltage $V2_{RESET}$ to a bit line selected by the column decoder 206.

Memorization voltage $V1_{WRITE}$ is, for example, a pulse voltage which has a voltage value of +1.5 V and a pulse width of 50 nsec. Memorization voltage $V2_{WRITE}$ is, for example, a pulse voltage which has a voltage value of −1.5 V and a pulse width of 50 nsec. Herein, the potential difference between memorization voltage $V1_{WRITE}$ and memorization voltage $V2_{WRITE}$ is 3 V.

Reproduction voltage $V1_{READ}$ and reproduction voltage $V2_{READ}$ have, for example, a voltage value of +0.5 V. Herein, reproduction voltage $V1_{READ}$ and reproduction voltage $V2_{READ}$ are equal to each other.

Reset voltage $V1_{RESET}$ is, for example, a pulse voltage which has a voltage value of −1.5 V and a pulse width of 50 nsec. Reset voltage $V2_{RESET}$ is, for example, a pulse voltage which has a voltage value of +1.5 V and a pulse width of 50 nsec. Herein, the potential difference between reset voltage $V1_{RESET}$ and reset voltage $V2_{RESET}$ is 3 V.

<Operation>

Next, an operation of the memory device 200 shown in FIG. 11 is described. The operation modes of the memory device 200 include the memorization mode where input data Din is written in a memory cell, the reset mode where information written in a memory cell is reset, and the reproduction mode where information written in a memory cell is output (reproduced) as output data Dout. It is assumed herein that the memory cells MC211, MC212, MC221 and MC222 are initialized to the high resistance state. It is further assumed that address signal ADDRESS indicates the address of the memory cell MC211.

[Memorization Mode]

In the first place, the operation in the memorization mode is described.

When input data Din represents "1", the control section 203 outputs a control signal CONT which indicates "application of memorization voltage" to the word line driver 205 and the bit line driver 207. When input data Din represents "0", the control section 203 does not output a control signal CONT.

Receiving the control signal CONT which indicates "application of memorization voltage" from the control section 203, the bit line driver 207 applies memorization voltage $V2_{WRITE}$ to a word line selected by the column decoder 206 and pulls the other bit lines B2 (unselected bit lines) down to the ground.

In the meantime, receiving the control signal CONT which indicates "application of memorization voltage" from the control section 203, the word line driver 205 applies memorization voltage $V1_{WRITE}$ to a word line selected by the row decoder 204 and pulls the other word lines W2 (unselected word lines) down to the ground.

Since in the memory cell MC211 a pulse voltage (positive (+) pulse voltage) which has a voltage value of +3 V and a pulse width of 50 nsec has been applied, the resistance value of the memory cell MC211 results in the low resistance state.

Although in the memory cell MC212 a pulse voltage (negative (−) pulse voltage) which has a voltage value of −1.5 V and a pulse width of 50 nsec has been applied, the resistance state of the memory cell MC212 does not change because the voltage value of the applied pulse voltage is short of a predetermined level (herein "−3 V").

Although in the memory cell MC221 a pulse voltage (positive (+) pulse voltage) which has a voltage value of +1.5 V and a pulse width of 50 nsec has been applied, the resistance state of the memory cell MC221 does not change because the voltage value of the applied pulse voltage is short of a predetermined level (herein "+3 V").

Since the potential different between the ends of the memory cell MC222 is 0 V, the resistance state of the memory cell MC222 does not change.

Thus, since only the resistance state of the memory cell MC211 changes to the "low resistance state", 1-bit data representing "1" is written in the memory cell MC211.

After the writing of data in the memory cell MC211 has been completed, new address signal ADDRESS is input to the address buffer 202, and the above-described operation in the memorization mode is repeated.

[Reproduction Mode]

Next, the operation in the reproduction mode is described.

The control section 203 outputs a control signal CONT which indicates "application of reproduction voltage" to the word line driver 205 and the bit line driver 207.

Receiving the control signal CONT which indicates "application of reproduction voltage" from the control section 203, the bit line driver 207 applies reproduction voltage $V2_{READ}$ to bit lines which are not selected by the column decoder 206 and pulls the other bit line B1 (selected bit line) down to the ground.

In the meantime, receiving the control signal CONT which indicates "application of reproduction voltage" from the control section 203, the word line driver 205 applies reproduction voltage $V1_{READ}$ to a word line selected by the row decoder 204 and pulls the other word lines W2 (unselected word lines) down to the ground.

Since in the memory cell MC211 a positive (+) measurement voltage has been applied, an electric current having a current value determined according to the resistance value of the memory cell MC211 flows through the memory cell MC211 and then comes into the bit line B1.

Since the potential different between the ends of the memory cell MC212 is 0 V, no electric current flows through the memory cell MC212. Since in the memory cell MC212 the direction extending from the bit line B1 to the word line W2 is "reverse direction", there is no possibility that the electric current flowing through the bit line B1 flows into the word line W2.

Since the potential different between the ends of the memory cell MC221 is 0 V, no electric current flows through the memory cell MC221.

Since in the memory cell MC222 a negative (−) measurement voltage has been applied, no electric current flows through the memory cell MC222.

Then, the bit line driver 207 measures the current value of an electric current flowing through the bit line B1 or B2 and outputs to the control section 203 signal $I_{READ}$ which indicates the measured current value. The control section 203 then outputs output data Dout which is determined according to the current value indicated by signal $I_{READ}$ to an external device. For example, if the measured current value is a current value of an electric current which flows in the case of the low resistance state, output data Dout which is output from the control section 203 represents "1".

Thus, since an electric current flows only through the memory cell MC211 and the electric current flowing through the memory cell MC211 comes into the bit line B1, 1-bit data is read from the memory cell MC211.

After the reading of data from the memory cell MC211 has been completed, new address signal ADDRESS is input to the address buffer 202, and the above-described operation in the reproduction mode is repeated.

[Reset Mode]

Next, the operation in the reset mode is described.

The control section 203 checks the memory state of the memory cell MC211 through the process of the reproduction mode.

In the case where the control section 203 determines that the memory cell MC211 stores bit data representing "1" (the memory cell MC211 is at the low resistance state), the control section 203 outputs a control signal CONT which indicates "application of reset voltage" to the word line driver 205 and the bit line driver 207. In the case where the memory cell MC211 stores bit data representing "1" (the memory cell MC211 is at the high resistance state), the control section 203 does not output a control signal CONT.

Receiving the control signal CONT which indicates "application of reset voltage" from the control section 203, the bit line driver 207 applies reset voltage $V2_{RESET}$ to a bit line B1 selected by the column decoder 206 and pulls the other bit lines B1 (unselected bit lines) down to the ground.

In the meantime, receiving the control signal CONT which indicates "application of reset voltage" from the control section 203, the word line driver 205 applies reset voltage $V1_{RESET}$ to a word line selected by the row decoder 204 and pulls the other word lines W2 (unselected word lines) down to the ground.

Since in the memory cell MC211 a pulse voltage (negative (−) pulse voltage) which has a voltage value of −3 V and a pulse width of 50 nsec has been applied, the resistance value of the memory cell MC211 results in the high resistance state.

Although in the memory cell MC212 a pulse voltage (positive (+) pulse voltage) which has a voltage value of +1.5 V and a pulse width of 50 nsec has been applied, the resistance state of the memory cell MC212 does not change because the voltage value of the applied pulse voltage is short of a predetermined level (herein "+3 V").

Although in the memory cell MC221 a pulse voltage (negative (−) pulse voltage) which has a voltage value of −1.5 V and a pulse width of 50 nsec has been applied, the resistance state of the memory cell MC221 does not change because the voltage value of the applied pulse voltage is short of a predetermined level (herein "−3 V").

Since the potential different between the ends of the memory cell MC222 is 0 V, the resistance state of the memory cell MC222 does not change.

Thus, since only the resistance state of the memory cell MC211 changes to the "high resistance state", 1-bit data stored in the memory cell MC211 is reset.

After the resetting of the memory cell MC211 has been completed, new address signal ADDRESS is input to the address buffer 202, and the above-described operation in the reset mode is repeated.

<Effects>

As described above, since the electric element (memory cell) has the "diode characteristic", no electric current flows from a word line to another word line. Thus, a memory device can be produced without additionally providing a diode element, and therefore, the production process can be simplified.

According to embodiment 2, a predetermined pulse voltage is applied to an electric element in which information is to be stored, while the predetermined pulse voltage is not applied to the other electric elements. As a result, only the resistance state of the electric element in which information is to be stored can be changed. That is, it is possible to arbitrarily select an electric element and store information in the selected electric element.

According to embodiment 2, in an electric element from which information is to be read, an electric current flows in the forward direction, while no electric current flows in the forward direction in the other electric elements. Thus, it is possible to read only the electric current flowing through the electric element from which information is to be read. That is, it is possible to arbitrarily select an electric element and read information stored in the selected electric element.

FIG. 11 shows only four memory cells but the present invention is not limited thereto. For example, 5 or more memory cells may be arranged in a matrix.

Embodiment 3

<Structure>

Figure 12:
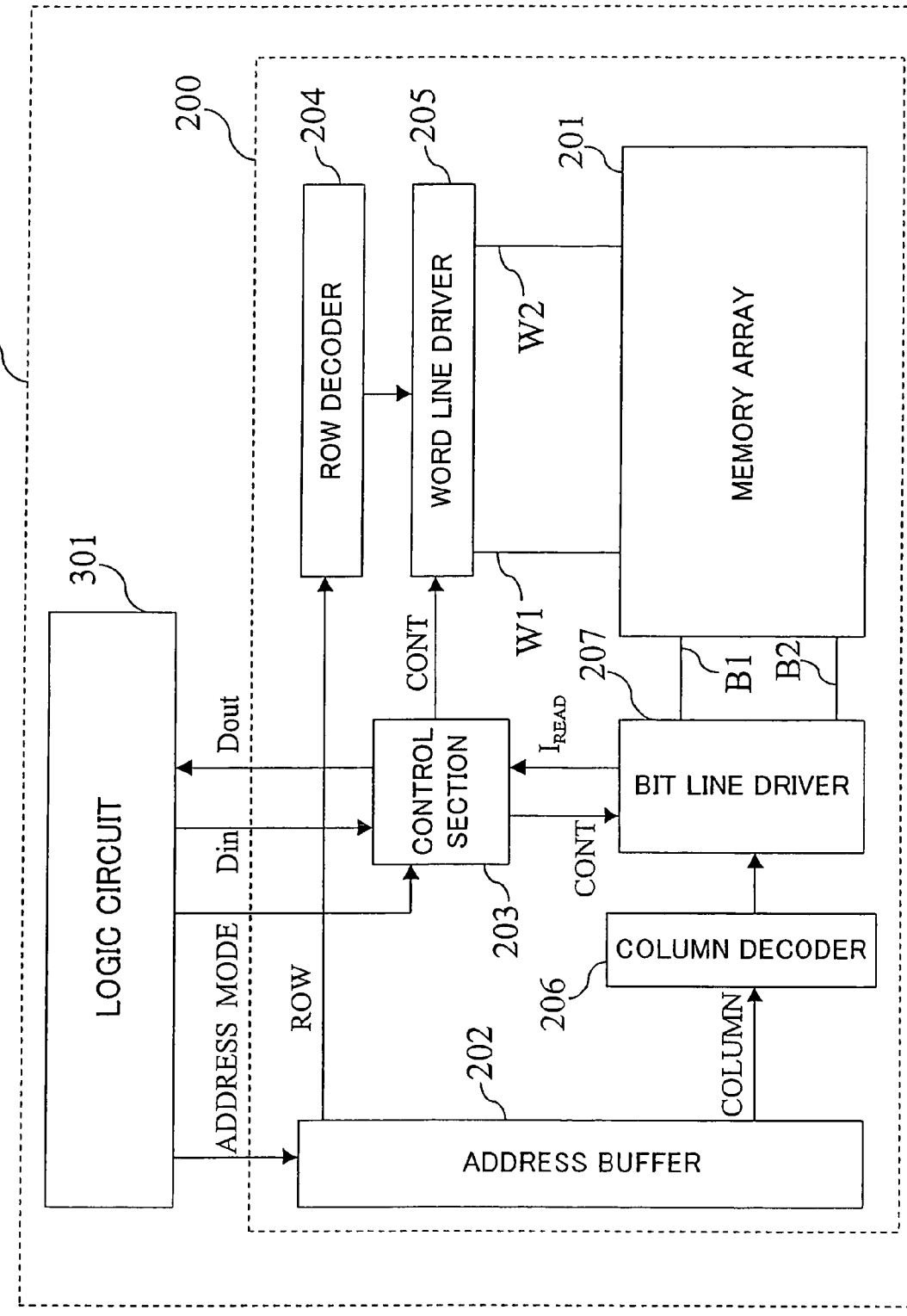
FIG. 12 shows a general structure of a semiconductor integrated circuit according to embodiment 3 of the present invention.

The structure of a semiconductor integrated circuit (Embedded-RAM) 300 according to embodiment 3 of the present invention is shown in FIG. 12. The circuit 300 includes the memory device 200 shown in FIG. 11 and a logic circuit 301 and is formed as a single semiconductor chip. The memory device 200 shown in FIG. 11 is used as a data RAM. The logic circuit 301 is a circuit which performs a predetermined operation (e.g., encoding or decoding of sound data or image data) and uses the memory device 200 in the operation. The logic circuit 301 controls address signal ADDRESS and mode selection signal MODE which are supplied to the memory device 200 to write data in or read data from the memory device 200.

<Operation>

Next, the operation of the semiconductor integrated circuit (Embedded-RAM) 300 shown in FIG. 12 is described. The operation of the circuit 300 includes a write process for writing predetermined data (bit data) in the memory device 200, a read process for reading data written in the memory device 200, and a reset process for resetting data written in the memory device 200.

[Write Process]

In the first place, the write process is described.

To write predetermined data (for example, encoded moving picture data, or the like) in the memory device 200, the logic circuit 301 outputs a mode selection signal MODE which indicates "memorization mode" to the control section 203 of the memory device 200.

Then, to select memory cells in which the predetermined data is to be written, the logic circuit 301 sequentially outputs address signals ADDRESS to the address buffer 202 of the memory device 200. As a result, in the memory device 200, memory cells are sequentially selected according to address signals ADDRESS.

Then, the logic circuit 301 outputs the predetermined data on a bit-by-bit basis as 1-bit data Din to the control section 203 of the memory device 200.

Then, in the memory device 200, the same operation as that of the memorization mode of embodiment 2 is performed. As a result, the predetermined data is written in the memory device 200 on a bit-by-bit basis.

[Read Process]

Next, the read process is described.

To read data written in the memory device 200, the logic circuit 301 outputs a mode selection signal MODE which indicates "reproduction mode" to the control section 203 of the memory device 200.

Then, to select memory cells from which written data is to be read, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reproduction mode of embodiment 2 is performed. As a result, the data stored in the memory device 200 is read on a bit-by-bit basis as output data Dout.

[Reset Process]

Next, the reset process is described.

To reset data written in the memory device 200, the logic circuit 301 outputs a mode selection signal MODE which indicates "reset mode" to the control section 203 of the memory device 200.

Then, to select memory cells in which stored data is to be reset, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reset mode of embodiment 2 is performed. As a result, the data stored in the memory device 200 is reset on a bit-by-bit basis.

<Effects>

As described above, a large amount of information can be stored quickly in the memory device 200.

Embodiment 4

<Structure>

Figure 13:
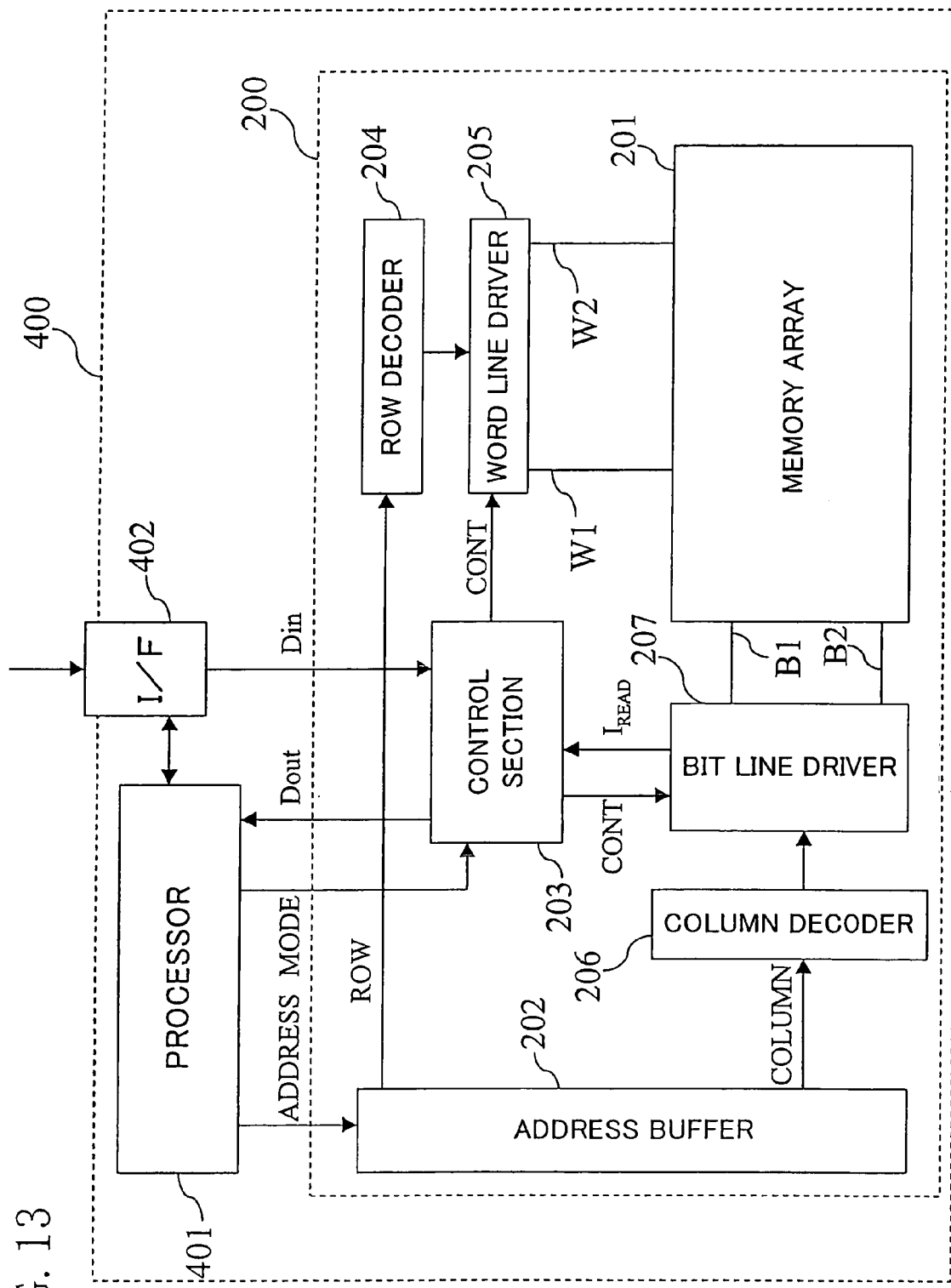
FIG. 13 shows a general structure of a semiconductor integrated circuit according to embodiment 4 of the present invention.

The structure of a semiconductor integrated circuit (reconfigurable LSI) 400 according to embodiment 4 of the present invention is shown in FIG. 13. The circuit 400 includes the memory device 200 shown in FIG. 11, a processor 401 and an interface 402 and is formed as a single semiconductor chip.

The memory device 200 shown in FIG. 11 is used as a program ROM to store a program necessary for the operation of the processor 401. The processor 401 operates according to the program stored in the memory device 200 to control the memory device 200 and the interface 402. The interface 402 sequentially outputs to the memory device 200 a program supplied from an external device.

<Operation>

Next, the operation of the semiconductor integrated circuit (reconfigurable LSI) 400 shown in FIG. 13 is described. The operation of the circuit 400 includes a program execution process wherein the circuit 400 operates according to a stored program and a program rewrite process for rewriting the program stored in the memory device 200 to another new program.

[Program Execution Process]

In the first place, the program execution process is described.

To read a program stored in the memory device 200, the processor 401 outputs a mode selection signal MODE which indicates "reproduction mode" to the control section 203 of the memory device 200.

Then, the processor 401 sequentially outputs to the address buffer 202 of the memory device 200 address signals ADDRESS indicative of memory cells in which the required program is stored. As a result, in the memory device 200, memory cells are sequentially selected according to address signals ADDRESS.

Then, in the memory device 200, the same operation as that of the reproduction mode of embodiment 2 is performed. As a result, the program stored in the memory device 200 is read on a bit-by-bit basis as output data Dout.

Then, the processor 401 performs a predetermined operation according to the program read from the memory device 200.

[Program Rewrite Process]

Next, the program rewrite process is described.

To erase a program stored in the memory device 200 (a program which is to be rewritten), the processor 401 outputs a mode selection signal MODE which indicates "reset mode" to the control section 203 of the memory device 200.

Then, the processor 401 sequentially outputs to the address buffer 202 of the memory device 200 address signals ADDRESS indicative of memory cells storing the program to be rewritten. As a result, in the memory device 200, memory cells are sequentially selected according to address signals ADDRESS.

Then, in the memory device 200, the same operation as that of the reset mode of embodiment 2 is performed. As a result, the program stored in the memory cells is reset on a bit-by-bit basis.

After the completion of the resetting of the memory cells, the processor 401 outputs a mode selection signal MODE which indicates "memorization mode" to the control section 203 of the memory device 200 in order to write a new program.

Then, the processor 401 sequentially outputs to the address buffer 202 of the memory device 200 address signals ADDRESS which indicate the positions of memory cells in which a new program is to be stored. As a result, in the memory device 200, memory cells are sequentially selected according to address signals ADDRESS.

Then, the processor 401 outputs a new program supplied from an external device through the interface 402 to the control section 203 of the memory device 200 on a bit-by-bit basis. In the memory device 200, the same operation as that of the memorization mode of embodiment 2 is performed. As a result, the new program is stored in the memory device 200 on a bit-by-bit basis.

Thus, since the memory device 200 is a rewritable nonvolatile memory, it is possible to rewrite a program stored in the memory device 200. That is, the function realized in the processor 401 can be changed. Further, it is possible that a plurality of programs are stored in the memory device 200, and the function realized in the processor 401 can be changed according to a program read out from the memory device 200.

<Effects>

As described above, different functions can be realized with a single LSI, i.e., a reconfigurable LSI is realized.

Embodiment 5

<Structure>

Figure 14:
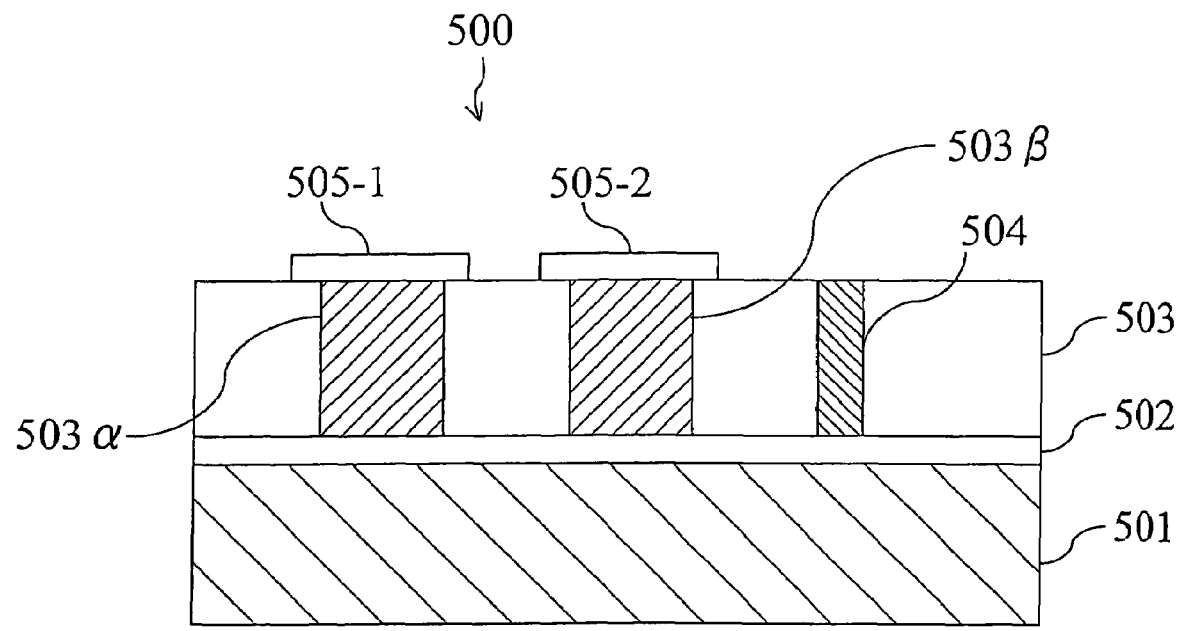
FIG. 14 shows a structure of a memory device according to embodiment 5 of the present invention.

The structure of a memory device 500 according to embodiment 5 of the present invention is shown in FIG. 14. The memory device 500 includes a substrate 501, a lower electrode 502 formed on the substrate 501, a state-variable material layer 503 and a contact plug 504 formed on the lower electrode 502, and upper electrodes 505-1 and 505-2 formed on the state-variable material layer 503. In this example, the lower electrode 502 is formed of Pt (work function: 5.7 eV), the upper electrodes 505-1 and 505-2 are formed of Ag (work function: 4.3 eV), and the state-variable material layer 503 is formed of $CuFe_2O_4$ (thickness: 0.1 μm). The contact plug 504 is formed of Al.

<State-Variable Material>

When a predetermined pulse voltage is applied between the upper electrode 505-1 and the lower electrode 502 shown in FIG. 14, the resistance value changes in a region of the state-variable material layer 503 directly below the upper electrode 505-1 (state variable region 503α). When a predetermined pulse voltage is applied between the upper electrode 505-2 and the lower electrode 502 shown in FIG. 14, the resistance value changes in a region of the state-variable material layer 503 directly below the upper electrode 505-2 (state variable region 503β).

When a positive (+) measurement voltage is applied between the upper electrode 505-1 and the lower electrode 502 shown in FIG. 14, an electric current having a current value determined according to the resistance value of the state variable region 503a flows from the contact plug 504. If a negative (−) measurement voltage is applied between the upper electrode 505-1 and the lower electrode 502 shown in FIG. 14, no electric current flows. As well, when a positive (+) measurement voltage is applied between the upper electrode 505-2 and the lower electrode 502 shown in FIG. 14, an electric current having a current value determined according to the resistance value of the state variable region 503β flows from the contact plug 504. If a negative (−) measurement voltage is applied between the upper electrode 505-2 and the lower electrode 502 shown in FIG. 14, no electric current flows.

<Equivalent Circuit>

Figure 15:
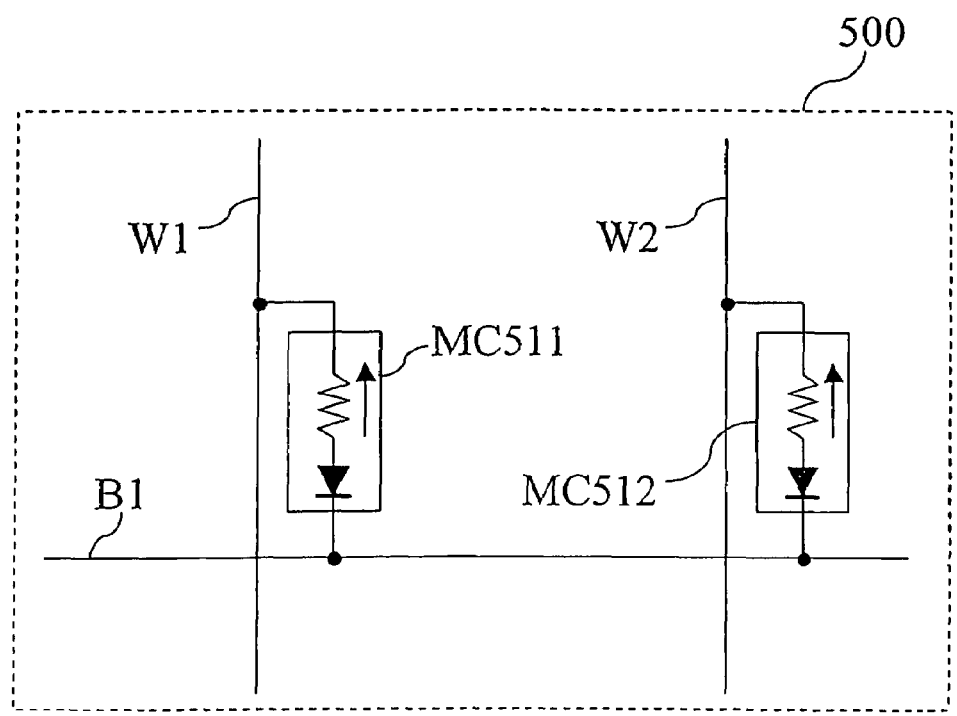
FIG. 15 shows an equivalent circuit of the memory device of FIG. 14.

The equivalent circuit of the memory device 500 of FIG. 14 is shown in FIG. 15. In FIG. 15, a word line W1 corresponds to the upper electrode 505-1, a word line W2 corresponds to the upper electrode 505-2, and the lower electrode 502 and the contact plug 504 correspond to a bit line B1. A memory cell MC511 corresponds to the state variable region 503α, and a memory cell MC512 corresponds to the state variable region 503β.

<Operation>

Then, the operation of the memory device 500 shown in FIG. 14 is described with reference to the equivalent circuit shown in FIG. 15. The operation of the memory device 500 shown in FIG. 14 includes a memorization mode where 1-bit data is memorized in a memory cell, a reset mode where 1-bit data is reset, and a reproduction mode where 1-bit data stored in a memory cell is reproduced.

[Memorization Mode]

In the first place, the bit line B1 (the lower electrode 502 and the contact plug 504) and the word line W2 (the upper electrode 505-2) are pulled down to the ground, and a memorization voltage is applied to the word line W1 (the upper electrode 505-1). The memorization voltage is, for example, a pulse voltage which has a voltage value of +3 V and a pulse width of 50 nsec. As a result, the resistance state of the memory cell MC511 (the state variable region 503α) changes from "high resistance state" to "low resistance state".

[Reset]

The bit line B1 and the word line W2 are pulled down to the ground, and a reset voltage is applied to the word line W1. The reset voltage is, for example, a pulse voltage which has a voltage value of −3 V and a pulse width of 50 nsec. As a result, the resistance state of the memory cell MC511 changes from "low resistance state" to "high resistance state".

[Reproduction]

The bit line B1 and the word line W2 are pulled down to the ground, and a reproduction voltage is applied to the word line W1. The reproduction voltage is, for example, a voltage which has a voltage value of +0.5 V. As a result, an electric current determined according to the resistance state of the memory cell MC511 flows out from the bit line B1. In the meantime, since in the memory cell MC512 the direction extending from the bit line B1 to the word line W2 is "reverse direction", no electric current flows from the bit line B1 to the word line W2 (from the upper electrode 505-1 to the upper electrode 505-2 through the lower electrode 502).

<Effects>

As described above, since the state-variable material has the "diode characteristic", the direction of the electric current can be defined without forming a diode therefor. Further, the state-variable material has the "variable-resistance characteristic" and therefore can be used as, for example, a 1R1D nonvolatile memory. In such a use, it is not necessary to form a diode, and therefore, the production process is simplified, as compared with a conventional 1R1D nonvolatile memory.

Since a diode is not formed, the polarity of a pulse voltage to be applied to the variable-resistance material is not restricted. Therefore, both a pulse voltage of positive (+) polarity and a pulse voltage of negative (−) polarity can be applied to the state-variable material layer. In such a pulse application method (wherein the resistance value is changed according to the polarity of the pulse voltage), the pulse width of a pulse voltage applied is short (50 nsec in embodiment 1) as compared with a conventional pulse application method (wherein the resistance value of the variable-resistance material is changed by adjusting the pulse width of the pulse voltage). That is, the time required for memorization or reset can be shortened.

In the above-described example of embodiment 5, the work functions of the upper electrodes 505-1 and 505-2 are different from that of the lower electrode 502. However, as a matter of course, the same effects can be obtained even if the crystallinity of the state variable region 503 is nonuniform as described in example 2.

Figure 16:
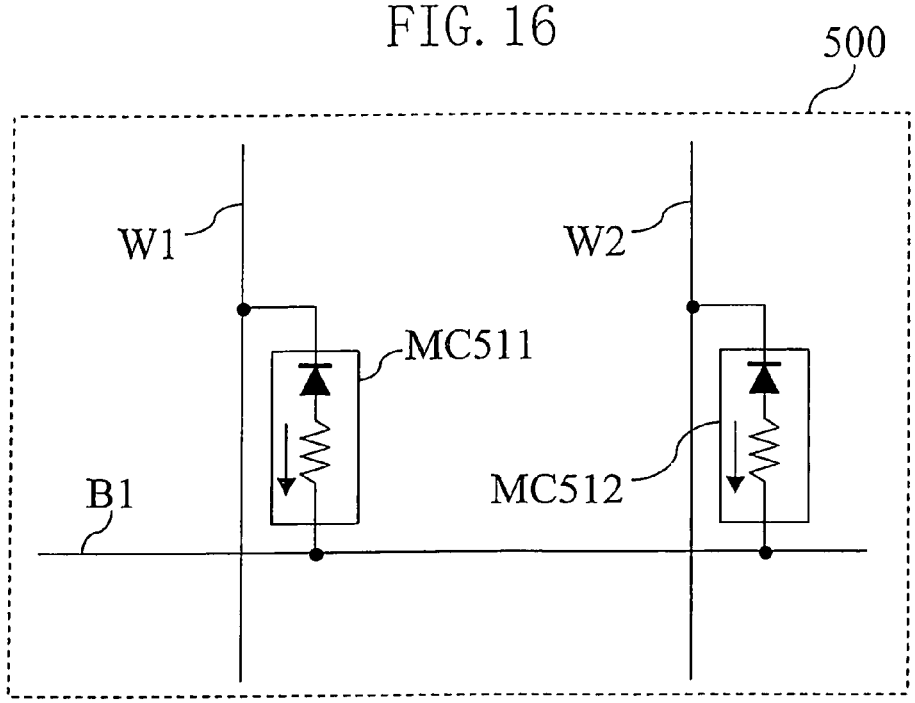
FIG. 16 shows an equivalent circuit of the memory device of FIG. 14.
Figure 17:
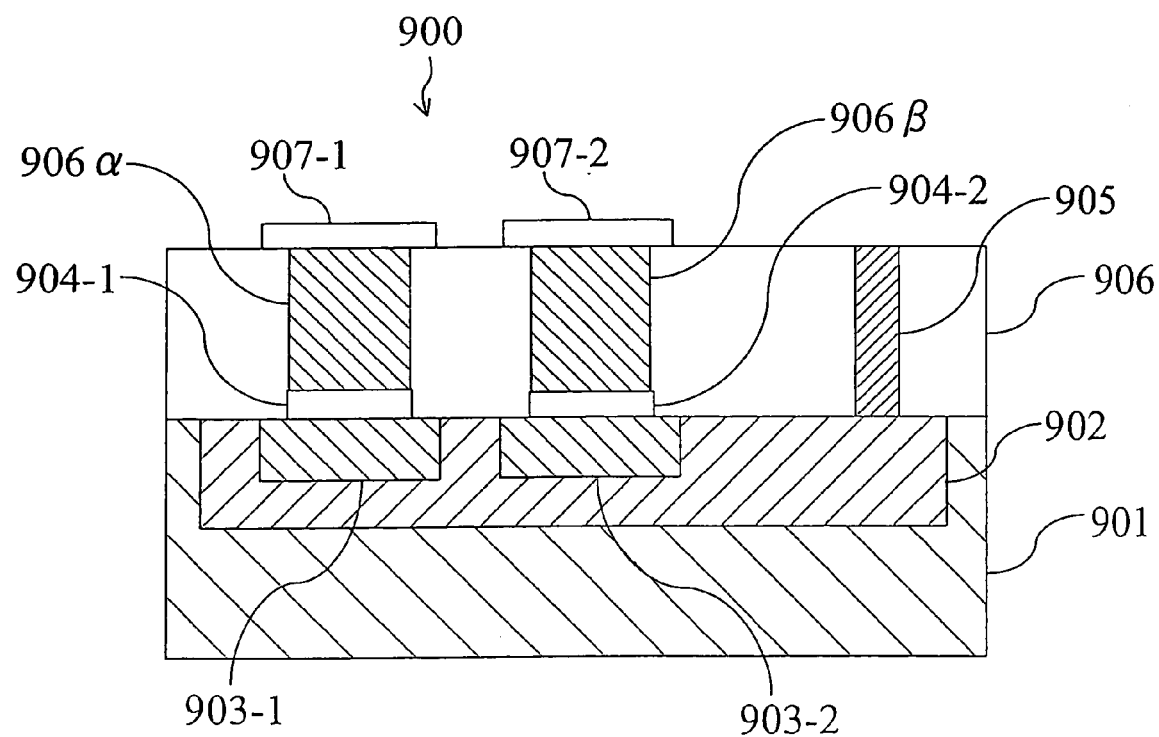
FIG. 17 shows a structure of a conventional memory device.
Figure 18:
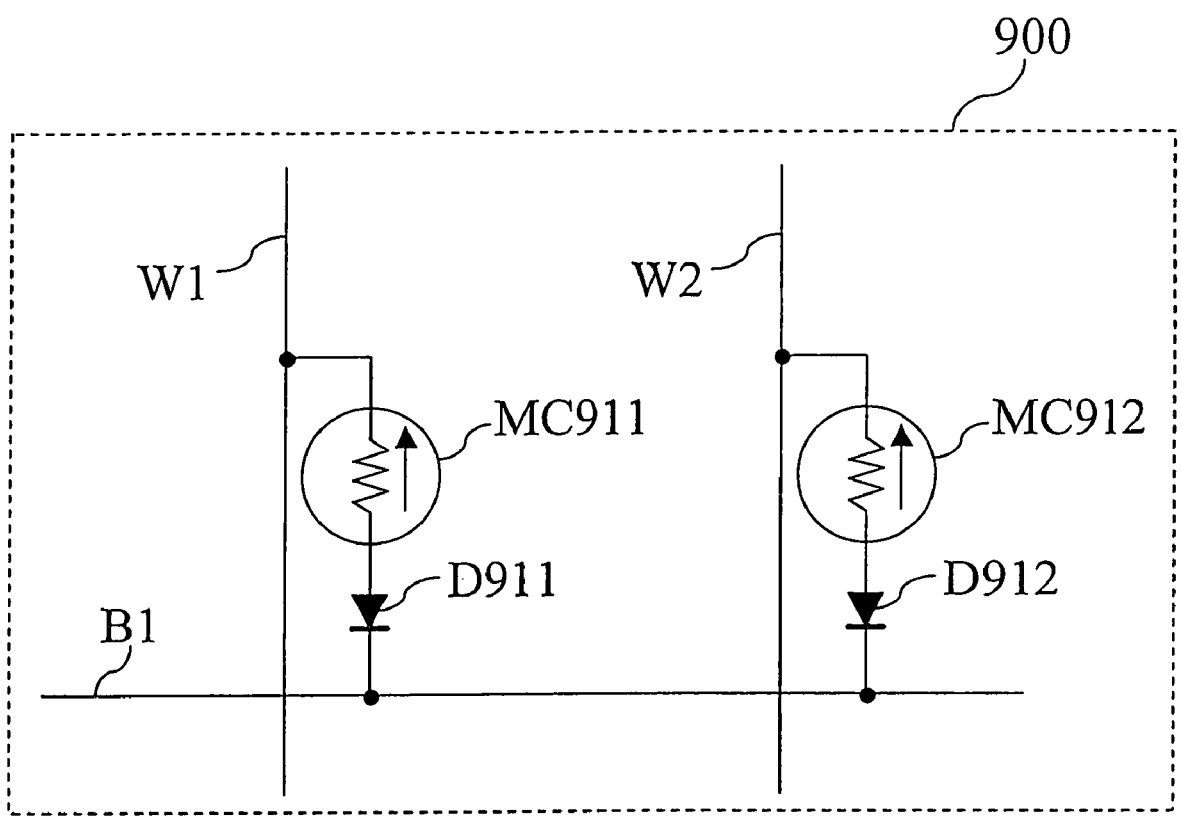
FIG. 18 shows an equivalent circuit of the memory device of FIG. 17.

The state-variable material described in the above example of embodiment 5 has a characteristic such that, when a pulse voltage is applied between the upper electrode 505-1 (505-2) and the lower electrode 502 such that the upper electrode 505-1 (505-2) becomes positive (+) with respect to the lower electrode 502, the resistance state of the state variable region 503α (503β) changes to "low resistance state" and a characteristic such that the direction extending from the upper electrode 505-1 (505-2) to the lower electrode 502 is "forward direction". Meanwhile, we also prepared another state-variable material having a characteristic such that, when a pulse voltage is applied between the upper electrode 505-1 (505-2) and the lower electrode 502 such that the upper electrode 505-1 (505-2) becomes negative (−) with respect to the lower electrode 502, the resistance state of the state variable region 503α (503β) changes to "low resistance state" and a characteristic such that the direction extending from the upper electrode 505-1 (505-2) to the lower electrode 502 is "reverse direction" (for example, sample (A') in example 1). In the case where the state variable region 503 exhibits such a characteristic, the equivalent circuit of the memory device 500 of FIG. 14 is as shown in FIG. 16. Further, in this case, the same effects can be obtained by application of the following voltages. In the memorization mode, a memorization voltage which has a voltage value of −3 V and a pulse width of 50 nsec is applied to the word line W1. In the reset mode, a reset voltage which has a voltage value of +3 V and a pulse width of 50 nsec is applied to the word line W1. In the reproduction mode, a reproduction voltage which has a voltage value of −0.5 V is applied to the word line W1.

The above-described example of embodiment 5 has two upper electrodes, but the present invention is not limited thereto. The same effects can be achieved even when three or more upper electrodes are formed.

In the above descriptions, the resistance state of the electric element can be changed when an applied pulse voltage satisfies predetermined conditions. Thus, in the memorization and reset operations, a pulse voltage which satisfies corresponding conditions is applied to the electric element, and in the reproduction operation, a voltage which does not satisfy the conditions is applied to the electric element, whereby the same effects can be achieved. That is, although in the above-described example the resistance state of the electric element changes from "high resistance state" to "low resistance state" when a voltage having a voltage value of +3 V and a pulse width of 50 nsec is applied, the same effects can be achieved even when the applied pulse voltage has different voltage value and pulse width.

It should be noted that, in the above descriptions of the examples, the normalized value of a resistance change (R/R0) is not necessarily equal to the value shown in the drawings.

INDUSTRIAL APPLICABILITY

An electric element of the present invention is useful as a next-generation nonvolatile memory capable of low-power operation, high-speed writing and erasing, and larger memory capacity, or the like.

The invention claimed is:

1. An electric element, comprising:
a first electrode;
a second electrode; and
a layer connected between the first electrode and the second electrode and having a diode characteristic and a variable resistance characteristic,
wherein the layer conducts a substantial electric current in a forward direction extending from one of the first electrode and the second electrode to the other electrode as compared to a reverse direction opposite of the forward direction, and the resistance value of the layer for the forward direction increases or decreases according to a predetermined pulse voltage applied between the first electrode and the second electrode.

2. The electric element of claim 1, wherein the work function of the first electrode is different from that of the second electrode.

3. The electric element of claim 2, wherein:
the work function of the first electrode is smaller than that of the second electrode; and
the layer exhibits a diode characteristic such that the forward direction is the direction extending from the first electrode to the second electrode.

4. The electric element of claim 2, wherein:
the work function of the first electrode is greater than that of the second electrode; and
the layer exhibits a diode characteristic such that the forward direction is the direction extending from the second electrode to the first electrode.

5. The electric element of claim 3, wherein:
when a pulse voltage is applied between the first electrode and the second electrode such that the first electrode becomes positive with respect to the second electrode, the resistance value of the layer for the forward direction decreases; and
when a pulse voltage is applied between the first electrode and the second electrode such that the first electrode becomes negative with respect to the second electrode, the resistance value of the layer for the forward direction increases.

6. The electric element of claim 4, wherein:
when a pulse voltage is applied between the first electrode and the second electrode such that the first electrode becomes positive with respect to the second electrode, the resistance value of the layer for the forward direction decreases; and
when a pulse voltage is applied between the first electrode and the second electrode such that the first electrode becomes negative with respect to the second electrode, the resistance value of the layer for the forward direction increases.

7. The electric element of claim 3, wherein:
when a pulse voltage is applied between the first electrode and the second electrode such that the first electrode becomes positive with respect to the second electrode, the resistance value of the layer for the forward direction increases; and
when a pulse voltage is applied between the first electrode and the second electrode such that the first electrode becomes negative with respect to the second electrode, the resistance value of the layer for the forward direction decreases.

8. The electric element of claim 4, wherein:
when a pulse voltage is applied between the first electrode and the second electrode such that the first electrode becomes positive with respect to the second electrode, the resistance value of the layer for the forward direction increases; and
when a pulse voltage is applied between the first electrode and the second electrode such that the first electrode becomes negative with respect to the second electrode, the resistance value of the layer for the forward direction decreases.

9. The electric element of claim 1, wherein the crystallinity of the layer is nonuniform.

10. The electric element of claim 9, wherein:
the crystallinity uniformity decreases in the reverse direction; and
the forward direction extends from the first electrode to the second electrode.

11. The electric element of claim 10, wherein:
a positive initialization voltage is applied from the first electrode to the second electrode;
when a pulse voltage is applied between the first electrode and the second electrode such that the first electrode becomes positive with respect to the second electrode, the resistance value of the layer for the forward direction decreases; and
when a pulse voltage is applied between the first electrode and the second electrode such that the first electrode becomes negative with respect to the second electrode, the resistance value of the layer for the forward direction increases.

12. The electric element of claim 10, wherein:
a negative initialization voltage is applied from the first electrode to the second electrode;
when a pulse voltage is applied between the first electrode and the second electrode such that the first electrode becomes positive with respect to the second electrode, the resistance value of the layer for the forward direction increases; and
when a pulse voltage is applied between the first electrode and the second electrode such that the first electrode becomes negative with respect to the second electrode, the resistance value of the layer for the forward direction decreases.

13. The electric element of claim 1, wherein the electric element stores 1-bit or multi-bit information by applying a predetermined pulse voltage between the first electrode and the second electrode such that the resistance value for the forward direction is changed.

14. The electric element of claim 1, wherein 1-bit or multi-bit information is read from the electric element by applying a predetermined pulse voltage between the first electrode and the second electrode such that an electric current flows in the forward direction according to the resistance value of the layer.

15. A memory device, comprising:
a plurality of electric elements of claim 1 formed in a matrix;
a plurality of word lines;
a word line driver for applying a predetermined voltage to the plurality word lines;
a plurality of bit lines; and
a bit line driver for applying a predetermined voltage to the plurality bit lines,
wherein in each of the plurality of electric elements, the first electrode is connected to any one of the plurality of word lines, and the second electrode is connected to any one of the plurality of bit lines.

16. The memory device of claim 15, wherein in order to store information in any one of the plurality electric elements,
the word line driver applies a first pulse voltage to one of the plurality of word lines which is connected to an electric element in which the information is to be stored, and
the bit line driver applies a second pulse voltage to one of the plurality of bit lines which is connected to the electric element in which the information is to be stored.

17. The memory device of claim 15, wherein in order to reproduce information stored in any one of the plurality of electric elements, the word line driver applies a reproduction voltage to one of the plurality of word lines which is connected to an electric element from which the information is to be read, and the bit line driver applies the reproduction voltage to the plurality of bit lines except for the one that is connected to the electric element from which the information is to be read.

18. A semiconductor integrated circuit, comprising:
the memory device of claim 15; and
a logic circuit for performing a predetermined operation,
wherein the logic circuit has a memorization mode and a reproduction mode,
in the memorization mode, the logic circuit stores bit data in the memory device, and
in the reproduction mode, the logic circuit reads bit data stored in the memory device.

19. A semiconductor integrated circuit, comprising:
the memory device of claim 15; and
a processor which has a program execution mode and a program rewrite mode,
wherein in the program execution mode, the processor operates according to a program stored in the memory device, and
in the program rewrite mode, the processor rewrites a program stored in the memory device to another new program received from outside.

20. The electric element of claim 1, wherein the layer comprises a metal oxide having a spinel structure.

21. The electric element of claim 1, wherein the layer comprises a ferroelectric oxide containing a metal added thereto.

22. The electric element of claim 21, wherein the ferroelectric oxide has an ilmenite structure.

23. The electric element of claim 1, wherein the layer comprises a metal oxide having a perovskite structure.

24. The electric element of claim 23, wherein the metal oxide has at least one of a CMR characteristic and high-temperature superconductivity.

25. The electric element of claim 1, wherein the layer does not contain an alkali metal or alkaline-earth metal.

26. The electric element of claim 1, comprising:
a lower electrode corresponding to the second electrode and formed on a substrate, wherein the layer is formed on the lower electrode; and
an upper electrode corresponding to the first electrode and formed on the layer,
wherein the layer includes a region between the upper electrode and the lower electrode and having a diode characteristic and a variable resistance characteristic.

27. The electric element of claim 26, wherein:
the work function of the upper electrode is smaller than that of the lower electrode;
the region exhibits the diode characteristic such that the forward direction extends from the upper electrode to the lower electrode;
when a pulse voltage is applied between the upper electrode and the lower electrode such that the upper electrode becomes positive with respect to the lower electrode, the resistance value of the region for the forward direction decreases; and
when a pulse voltage is applied between the upper electrode and the lower electrode such that the upper electrode becomes negative with respect to the lower electrode, the resistance value of the region for the forward direction increases.

28. The electric element of claim 26, wherein:
the work function of the upper electrode is greater than that of the lower electrode;
the region exhibits a diode characteristic such that the forward direction extends from the lower electrode to the upper electrode;
when a pulse voltage is applied between the upper electrode and the lower electrode such that the upper electrode becomes positive with respect to the lower electrode, the resistance value of the region for the forward direction decreases; and
when a pulse voltage is applied between the upper electrode and the lower electrode such that the upper electrode becomes negative with respect to the lower electrode, the resistance value of the region for the forward direction increases.

29. The electric element of claim 26, wherein:
the work function of the upper electrode is smaller than that of the lower electrode;
the region exhibits a diode characteristic such that the forward direction extends from the upper electrode to the lower electrode;
when a pulse voltage is applied between the upper electrode and the lower electrode such that the upper electrode becomes positive with respect to the lower electrode, the resistance value of the region for the forward direction increases; and
when a pulse voltage is applied between the upper electrode and the lower electrode such that the upper electrode becomes negative with respect to the lower electrode, the resistance value of the region for the forward direction decreases.

30. The electric element of claim 26, wherein:
the work function of the upper electrode is greater than that of the lower electrode;
the region exhibits a diode characteristic such that the forward direction extends from the lower electrode to the upper electrode;
when a pulse voltage is applied between the upper electrode and the lower electrode such that the upper electrode becomes positive with respect to the lower electrode, the resistance value of the region for the forward direction increases; and
when a pulse voltage is applied between the upper electrode and the lower electrode such that the upper electrode becomes negative with respect to the lower electrode, the resistance value of the region for the forward direction decreases.

31. The electric element of claim 26, wherein:
crystallinity uniformity of the layer decreases in one of the forward direction and the reverse direction;
the region exhibits a diode characteristic such that the forward direction extends from the upper electrode to the lower electrode;
when a pulse voltage is applied between the upper electrode and the lower electrode such that the upper electrode becomes positive with respect to the lower electrode, the resistance value of the region for the forward direction decreases; and
when a pulse voltage is applied between the upper electrode and the lower electrode such that the upper electrode becomes negative with respect to the lower electrode, the resistance value of the region for the forward direction increases.

32. The electric element of claim 26, wherein:
crystallinity uniformity of the layer decreases in one of the forward direction and the reverse direction;
the region exhibits a diode characteristic such that the forward direction extends from the upper electrode to the lower electrode;
when a pulse voltage is applied between the upper electrode and the lower electrode such that the upper electrode becomes positive with respect to the lower electrode, the resistance value of the region for the forward direction increases; and
when a pulse voltage is applied between the upper electrode and the lower electrode such that the upper electrode becomes negative with respect to the lower electrode, the resistance value of the region for the forward direction decreases.

33. The electric element of claim 26, wherein the upper electrode corresponds to a first upper electrode and the region corresponds to a first region further comprising a second upper electrode formed on the layer,
wherein the layer includes a second region between the second upper electrode and the lower electrode,
the second region conducts a substantial electric current in a forward direction extending from one of the second upper electrode and the lower electrode to the other electrode as compared to a reverse direction opposite of forward direction, and
the resistance value of the second region for the forward direction increases or decreases according to a predetermined pulse voltage applied between the second upper electrode and the lower electrode.

34. The electric element of claim 5, further comprising a voltage driver,
the voltage driver applying the pulse voltage between the first electrode and the second electrode such that the first electrode becomes negative with respect to the second electrode to increase the resistance value of the layer for the forward direction; and
the voltage driver applying the pulse voltage between the first electrode and the second electrode such that the first electrode becomes positive with respect to the second electrode to decrease the resistance value of the layer for the forward direction.

35. The electric element of claim 6, further comprising a voltage driver,
the voltage driver applying the pulse voltage between the first electrode and the second electrode such that the first electrode becomes negative with respect to the second electrode to increase the resistance value of the layer for the forward direction; and
the voltage driver applying the pulse voltage between the first electrode and the second electrode such that the first electrode becomes positive with respect to the second electrode to decrease the resistance value of the layer for the forward direction.

36. The electric element of claim 11, further comprising a voltage driver,
the voltage driver applying the pulse voltage between the first electrode and the second electrode such that the first electrode becomes negative with respect to the second electrode to increase the resistance value of the layer for the forward direction; and
the voltage driver applying the pulse voltage between the first electrode and the second electrode such that the first electrode becomes positive with respect to the second electrode to decrease the resistance value of the layer for the forward direction.

37. The electric element of claim 7, further comprising a voltage driver,
the voltage driver applying the pulse voltage between the first electrode and the second electrode such that the first electrode becomes positive with respect to the second electrode to increase the resistance value of the layer for the forward direction; and
the voltage driver applying the pulse voltage between the first electrode and the second electrode such that the first electrode becomes negative with respect to the second electrode to decrease the resistance value of the layer for the forward direction.

38. The electric element of claim 8, further comprising a voltage driver,
the voltage driver applying the pulse voltage between the first electrode and the second electrode such that the first electrode becomes positive with respect to the second electrode to increase the resistance value of the layer for the forward direction; and
the voltage driver applying the pulse voltage between the first electrode and the second electrode such that the first electrode becomes negative with respect to the second electrode to decrease the resistance value of the layer for the forward direction.

39. The electric element of claim 12, further comprising a voltage driver,
the voltage driver applying the pulse voltage between the first electrode and the second electrode such that the first electrode becomes positive with respect to the second electrode to increase the resistance value of the layer for the forward direction; and
the voltage driver applying the pulse voltage between the first electrode and the second electrode such that the first electrode becomes negative with respect to the second electrode to decrease the resistance value of the layer for the forward direction.

40. The electric element of claim 5, further comprising a voltage driver for applying a measurement voltage between the first electrode and the second electrode such that the first electrode becomes positive with respect to the second electrode in order to measure a resistance value of the layer for the forward direction.

41. The electric element of claim 7, further comprising a voltage driver for applying a measurement voltage between the first electrode and the second electrode such that the first electrode becomes positive with respect to the second electrode in order to measure a resistance value of the layer for the forward direction.

42. The electric element of claim 11, further comprising a voltage driver for applying a measurement voltage between the first electrode and the second electrode such that the first electrode becomes positive with respect to the second electrode in order to measure a resistance value of the layer for the forward direction.

43. The electric element of claim 12, further comprising a voltage driver for applying a measurement voltage between the first electrode and the second electrode such that the first electrode becomes positive with respect to the second electrode in order to measure a resistance value of the layer for the forward direction.

44. The electric element of claim 6, further comprising a voltage driver for applying a measurement voltage between the first electrode and the second electrode such that the first electrode becomes negative with respect to the second electrode in order to measure a resistance value of the layer for the forward direction.

45. The electric element of claim 8, further comprising a voltage driver for applying a measurement voltage between the first electrode and the second electrode such that the first electrode becomes negative with respect to the second electrode in order to measure a resistance value of the layer for the forward direction.

46. The memory device of claim 15, wherein each of the plurality of memory elements is configured to emulate a diode.

* * * * *